(12) United States Patent
Ohnishi et al.

(10) Patent No.: US 6,893,934 B2
(45) Date of Patent: May 17, 2005

(54) BIPOLAR TRANSISTOR DEVICE HAVING PHOSPHOROUS

(75) Inventors: Teruhit Ohnishi, Osaka (JP); Akira Asai, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 18 days.

(21) Appl. No.: 10/603,737

(22) Filed: Jun. 26, 2003

(65) Prior Publication Data

US 2004/0089918 A1 May 13, 2004

Related U.S. Application Data

(62) Division of application No. 10/009,201, filed as application No. PCT/JP01/03979 on May 14, 2001, now Pat. No. 6,674,149.

(30) Foreign Application Priority Data

May 12, 2000 (JP) ........................................ 2000-140292

(51) Int. Cl.[7] .............................................. H01L 21/331
(52) U.S. Cl. ...................... 438/369; 438/234; 438/313; 438/376; 438/356; 438/357
(58) Field of Search ................... 438/234, 235, 438/313, 369, 376, 378, 356, 357, 317; 257/591

(56) References Cited

U.S. PATENT DOCUMENTS

| | | | | |
|---|---|---|---|---|
| 4,975,381 A | * | 12/1990 | Taka et al. | ............... 438/367 |
| 5,587,326 A | * | 12/1996 | Takemura | ................ 438/365 |
| 5,773,340 A | | 6/1998 | Kumauchi et al. | |
| 6,040,225 A | | 3/2000 | Boles | |
| 6,346,452 B1 | * | 2/2002 | Kabir et al. | ............... 438/312 |
| 6,455,364 B1 | * | 9/2002 | Asai et al. | ............... 438/235 |
| 6,492,711 B1 | * | 12/2002 | Takagi et al. | ............... 257/593 |

FOREIGN PATENT DOCUMENTS

| | | |
|---|---|---|
| JP | 56-85858 | 7/1981 |
| JP | 5-102177 | 4/1993 |
| JP | 07-106452 | 4/1995 |
| JP | 11312686 | 11/1999 |
| JP | 2000-36499 | 2/2000 |
| JP | 2000-68283 | 3/2000 |

OTHER PUBLICATIONS

Washio, K., "SiGe HBTs and ICs for optical–fiber communication systems", Solid–State Electronics, Aug., 1999, vol. 43, No. 8, pp. 1619–1625.
International Search Report dated Aug. 6, 2001.
International Search Report dated Jun. 26, 2001.

* cited by examiner

*Primary Examiner*—Maria F. Guerrero
(74) *Attorney, Agent, or Firm*—McDermott Will & Emery LLP

(57) ABSTRACT

A $Si_{1-x}Ge_x$ layer 111b functioning as the base composed of an i—$Si_{1-x}Ge_x$ layer and a $p^+$ $Si_{1-x}Ge_x$ layer is formed on a collector layer 102, and a Si cap layer 111a as the emitter is formed on the $p^+$ $Si_{1-x}Ge_x$ layer. An emitter lead electrode 129, which is composed of an $n^-$ polysilicon layer 129b containing phosphorus in a concentration equal to or lower than the solid-solubility limit for single-crystal silicon and a $n^+$ polysilicon layer 129a containing phosphorus in a high concentration, is formed on the Si cap layer 111a in a base opening 118. The impurity concentration distribution in the base layer is properly maintained by suppressing the Si cap layer 111a from being doped with phosphorus (P) in an excessively high concentration. The upper portion of the Si cap layer 111a may contain a p-type impurity. The p-type impurity concentration distribution in the base layer of an NPN bipolar transistor is thus properly maintained.

8 Claims, 16 Drawing Sheets

PROIR ART

BIPOLAR TRANSISTOR DEVICE HAVING PHOSPHOROUS

This application is a divisional of Application Ser. No. 10/009,201 filed Dec. 10, 2001, now U.S. Pat. No. 6,674,149 which is a 371 application of PCT/JP01/03979, filed May 14, 2001.

TECHNICAL FIELD

The present invention relates to a semiconductor device and a method for fabricating the same, and more particularly to measures for attaining a proper impurity concentration distribution in a heterobipolar transistor or a Bi-CMOS device including a heterobipolar transistor.

BACKGROUND ART

In recent years, a heterobipolar transistor (HBT) has been developed at rapid paces, which is a bipolar transistor formed on a silicon substrate constructed to include a heterojunction structure such as Si/SiGe and Si/SiC to provide superior conduction property and thus enable operation in a higher frequency range. This type of HBT uses a Si/SiGe heterojunction structure formed by epitaxially growing a SiGe layer on a Si substrate. By use of this structure, it becomes possible to attain transistors operating in a high frequency range in which only transistors using a compound semiconductor substrate such as a GaAs substrate can operate so far. Since this HBT includes a Si substrate and a SiGe layer that are made of materials good in compatibility with the general silicon process, it has great advantages of high integrity and low cost. In particular, by forming a HBT and a MOS transistor (MOSFET) on a common Si substrate for integration, a high-performance Bi-CMOS device can be constructed. Such a Bi-CMOS device is promising as a system LSI usable in the communications industry.

As a bipolar transistor constituting the Bi-CMOS device, HBTs including a heterojunction structure such as $Si/Si_{1-x}Ge_x$ and $Si/Si_{1-y}C_y$ have been proposed/prototyped so far. A $Si/Si_{1-x}Ge_x$ HBT, among others, is considered promising from its features including that the band gap can be continuously adjusted using the nature of Si and Ge being solid-soluble to each other in substantially any percentages and the change in band gap with application of strain. For this reason, there have been made a number of proposals on SiGe Bi-CMOS devices in which a MOSFET having only Si layers and a $Si/Si_{1-x}Ge_x$ type HBT are formed on a common Si substrate.

FIG. 12 is a cross-sectional view illustrating a fabrication process of a conventional SiGe Bi-CMOS device. As shown in FIG. 12, the upper portion of a Si substrate 500 using the (001) face as the principal plane is occupied by a retrograde well 501 having a depth of 1 μm containing an n-type impurity such as phosphorus introduced by epitaxial growth, ion implantation, or the like. The concentration of the n-type impurity in a region near the surface of the Si substrate 500 is set to be about $1 \times 10^{17}$ atoms·cm$^{-3}$. As device isolation, provided are a shallow trench 503 with silicon oxide buried therein and a deep trench 504 constructed of an undoped polysilicon film 505 and a silicon oxide film 506 surrounding the undoped polysilicon film 505. The depths of the trenches 503 and 504 are about 0.35 μm and about 2 μm, respectively.

A collector layer 502 is provided in the region of the Si substrate 500 sandwiched by the adjacent trenches 503. An n$^+$ collector lead layer 507 for contacting with an electrode of the collector layer 502 via the retrograde well 501 is formed in a region of the Si substrate 500 separated from the collector layer 502 by the shallow trench 503.

A first buried oxide film 508 having a thickness of about 30 nm, which has a collector opening 510, is formed on the Si substrate 500. A $Si_{1-x}Ge_x$ layer 511b, composed of an undoped layer (i—$Si_{1-x}Ge_x$ layer) having a thickness of about 20 nm and a p-type impurity doped layer (p$^+$ $Si_{1-x}Ge_x$ layer) having a thickness of about 40 nm, is formed over the exposed portion of the Si substrate 500 in the collector opening 510 and the first buried oxide film 508. A Si cap layer 511a having a thickness of about 40 nm is then formed on the layer 511b. The Si cap layer 511a and the $Si_{1-x}Ge_x$ layer 511b constitute a $Si/Si_{1-x}Ge_x$ layer 511. The portion of the $Si/Si_{1-x}Ge_x$ layer 511 located in the collector opening 510 has a single-crystal structure formed by epitaxial growth on the underlying Si substrate 500, while the portion thereof located on the buried oxide film 508 has a polycrystal structure.

A second buried oxide film 512 having a thickness of about 30 nm is formed on the $Si/Si_{1-x}Ge_x$ layer 511 to serve as an etch stopper. The second buried oxide film 512 has base junction openings 514 and a base opening 518. A p$^+$ polysilicon layer 515 having a thickness of about 150 nm is formed burying the base junction openings 514 and expanding over the second buried oxide film 512, and a third buried oxide film 517 is formed on the p$^+$ polysilicon layer 515.

An opening is formed through the portion of the p$^+$ polysilicon layer 515 and the portion of the third buried oxide film 517 located above the base opening 518 of the second buried oxide film 512. A fourth buried oxide film 520 having a thickness of about 30 nm is formed on each side face of the p$^+$ polysilicon layer 515, and a sidewall 521 made of polysilicon having a thickness of about 100 nm is formed on the fourth buried oxide film 520. An n$^+$ polysilicon layer 529 is formed burying the base opening 518 and expanding over the third buried oxide film 517. The n$^+$ polysilicon layer 529 functions as an emitter lead electrode. The fourth buried oxide film 520 electrically isolates the p$^+$ polysilicon layer 515 from the n$^+$ polysilicon layer 529, and also blocks diffusion of an impurity from the p$^+$ polysilicon layer 515 into the n$^+$ polysilicon layer 529. Likewise, the third buried oxide film 517 isolates the top surface of the p$^+$ polysilicon layer 515 from the n$^+$ polysilicon layer 529.

Ti silicide layers 524 are formed on the collector lead layer 507, the p$^+$ polysilicon layer 515, and the n$^+$ polysilicon layer 529, and sidewalls 523 cover the outer side faces of the n$^+$ polysilicon layer 529 and the p$^+$ polysilicon layer 515. The entire substrate is covered with an interlayer insulating film 525. Connection holes are formed through the interlayer insulating film 525 to reach the Ti silicide layers 524 on the n$^+$ collector lead layer 507, the p$^+$ polysilicon layer 515 as part of an external base, and the n$^+$ polysilicon layer 529 as the emitter lead electrode. W plugs 526 bury the connection holes, and metal interconnections 527 connected to the W plugs 526 extend on the interlayer insulating film 525.

The structure of the emitter-base junction shown in the partial enlarged view in FIG. 12 will be described. The region of the $Si_{1-x}Ge_x$ layer 511b located under the base opening 518 functions as an internal base (intrinsic base) 519. The region of the Si cap layer 511a located immediately under the base opening 518, which contains boron introduced by diffusion from the n$^+$ polysilicon layer 529, functions as an emitter 530.

The remaining portion of the $Si/Si_{1-x}Ge_x$ layer 511 other than the region under the base opening 518 and the p$^+$ polysilicon layer 515 constitute an external base 516. Note that in the partial enlarged view, the portion of the Si/Si$_{1-x}$Ge$_x$ layer 511 excluding the region under the base opening 518 functions as the external base 516.

By the construction described above, provided is the Si/SiGe NPN heterobipolar transistor including the n$^+$-type emitter 530 made of Si single crystal, the p$^+$-type internal base 519 mainly made of Si$_{1-x}$Ge$_x$ single crystal, and the collector layer 502 made of Si single crystal. Note however that the emitter/base/collector are partitioned from one another, not by the boundaries of Si/SiGe crystals, but by changes of the conductivity type of impurities. Therefore, to be precise, the boundaries of the emitter/base/collector vary depending on the profiles of the impurities. In particular, for application as a device for high-frequency signal amplification, the profile of boron (B) as the p-type impurity in the internal base 519 plays a significantly important role. In view of this, the deposition of the Si$_{1-x}$G$_x$ layer 511$b$ is performed in the following manner.

As shown in FIG. 13, after the undoped i—Si$_{1-x}$Ge$_x$ layer (x is constant) is epitaxially grown on the collector layer (Si substrate), the boron-doped p$^+$ Si$_{1-x}$Ge$_x$ layer (x varies) and the Si cap layer are epitaxially grown sequentially on the undoped i—Si$_{1-x}$Ge$_x$ layer. The right side of FIG. 13 shows the distributions of the B concentration and the Ge content during the crystal growth for formation of the base layer. This indicates that the top portion of the p$^+$ Si$_{1-x}$Ge$_x$ layer, in which the Ge content is substantially zero, is hardly distinguished from the Si cap layer in composition. In a subsequent process including high-temperature treatment, boron in the p$^+$ Si$_{1-x}$Ge$_x$ layer is diffused, resulting in a slow B concentration distribution with boron spreading into part of the Si cap layer and part of the i—Si$_{1-x}$Ge$_x$ layer.

Problems to be Solved

In the conventional Si/SiGe heterobipolar transistor, it is difficult to suppress the spread of boron (B) in the Si$_{1-x}$Ge$_x$ layer 511$b$ during the fabrication process and eventually maintain a proper B concentration profile stably. It has been found that this spread of boron (B) deteriorates the characteristics of the heterobipolar transistor in the high-frequency range. To clarify why the B concentration profile loose stability, the present inventors performed the following experiment.

FIG. 14 is a view showing SIMS measurement data on the concentration distributions of phosphorus (P) and boron (B) and the Ge content in the emitter-base region of the conventional Si/SiGe heterobipolar transistor. Referring to FIG. 14, the x-axis represents the relative depth from point 0 conveniently determined, and the y-axis represents the secondary ion intensity (count number) that corresponds to the concentration (atoms.cm$^{-3}$) of phosphorus (P) or boron (B) and the Ge content. As shown in FIG. 14, the Ge content exhibits a sharp tilt profile indicating that a good composition was obtained. On the contrary, the boron (B) concentration distribution in the p$^+$ Si$_{1-x}$Ge$_x$ layer is slow, widely spreading into most part of the Si cap layer 511$a$. Boron (B) has two types, 10B and 11B, different in weight. It is known that, while both 10B and 11B exist in the Si$_{1-x}$Ge$_x$ layer when boron (B) was introduced into the Si$_{1-x}$Ge$_x$ layer be in-situ doping during the epitaxial growth, only 11B exists in the Si$_{1-x}$Ge$_x$ layer when boron (B) was introduced into the Si$_{1-x}$Ge$_x$ layer by ion implantation. Note that, in the SIMS measurement, since the region of a sample in which atoms such as impurity atoms are sputtered varies to some extent, the SIMS measurement data does not necessarily represent correct correspondence between the range of each region and the impurity concentration. However, the data at least represents a rough tendency between the range of each region and the impurity concentration.

Why the boron (B) concentration distribution spreads wider than expected as shown in FIG. 14 has not yet been clarified completely. However, from the data shown in FIG. 14 and facts revealed from other experiments, it has been found that some correlation exists between the phosphorus concentration and the boron (B) concentration with high possibility. More specifically, a tendency has been recognized that as the phosphorus (P) concentration in the emitter is higher, the boron (B) concentration distribution spreads wider in the p$^+$ Si$_{1-x}$Ge$_x$ layer. It is considered that point defects are related to this phenomenon, that is, as the phosphorus (P) concentration is higher, diffusion of boron (B) is facilitated. In other words, if point defects exist in a high concentration, B atoms are allowed to diffuse by migration via the point defects, not only by substitution for Si and Ge atoms. This increases the diffusion rate of B atoms during high-temperature treatment, and as a result, the boron (B) concentration distribution becomes slow.

The above phenomenon is induced from the concentration distribution of phosphorus (P) as follows. In the phosphorus (P) concentration distribution in the Si cap layer shown in FIG. 14, a region Re1 contains phosphorus (P) in a concentration exceeding the solid-solubility limit for Si single crystal (about 1×10$^{20}$ atoms.cm$^{-3}$). The excess amount of the phosphorus (P) exceeding the solid-solubility limit presumably enters inter-lattice spaces or forms voids, thereby generating point defects. In other words when the phosphorus (P) concentration is high in the Si$_{1-x}$Ge$_x$ layer, the number of point defects increases, which facilitates diffusion of boron (B) and thus spreads the B concentration distribution.

The n$^+$ polysilicon layer 529 functioning as the conventional emitter lead electrode is doped with phosphorus (P) in a concentration of about 5.0×10$^{20}$ atoms.cm$^{-3}$ as shown in FIG. 14, which is considerably high compared with the solid-solubility limit for Si single crystal. The reason for this high concentration is as follows. An impurity tends to segregate at grain boundaries in polysilicon. Therefore, if the polysilicon is not doped with phosphorus (P) in a high concentration as a whole, it fails to secure an impurity activation rate required to ensure low resistance.

DISCLOSURE OF THE INVENTION

An object of the present invention is providing a semiconductor device functioning as a bipolar transistor excellent in electric characteristics such as high-frequency characteristics and a method for fabricating such a semiconductor device, in which the concentration distribution of a p-type impurity such as boron (B) in a base layer of the heterobipolar transistor is properly maintained by providing a means for suppressing spread of the p-type impurity into a Si cap layer while keeping the impurity concentration required for securing the low-resistance characteristic of an emitter lead electrode and an emitter and desired operation of the bipolar transistor.

The first semiconductor device of the present invention includes: a substrate including an n-type first single-crystal semiconductor layer functioning as a collector layer; a p-type second single-crystal semiconductor layer formed on the first single-crystal semiconductor layer, functioning as a base layer; a third single-crystal semiconductor layer formed on the second single-crystal semiconductor layer an upper portion of the third single-crystal semiconductor layer containing phosphorus in a concentration equal to or less than the solid-solubility limit, at least part of the third single-crystal semiconductor layer functioning as an emitter; and an emitter lead electrode formed on the third single-crystal semiconductor layer, the emitter lead electrode being made of a semiconductor layer containing phosphorus in a concentration higher than that in the upper portion of the third single-crystal semiconductor layer.

Thus, since the third single-crystal semiconductor layer functioning as the emitter layer contains phosphorus only in a concentration equal to or lower than the solid-solubility limit, generation of point defects in the third single-crystal semiconductor layer is suppressed. This suppresses diffusion of a p-type impurity, for example, boron, in the second single-crystal semiconductor layer located under the third single-crystal semiconductor layer, and as a result, the p-type impurity concentration distribution is properly maintained in the second single-crystal semiconductor layer.

The second semiconductor device of the present invention includes: a substrate including an n-type first single-crystal semiconductor layer functioning as a collector layer; a p-type second single-crystal semiconductor layer formed on the first single-crystal semiconductor layer, the second single-crystal semiconductor layer containing a p-type impurity and functioning as a base layer; and a third single-crystal semiconductor layer formed on the second single-crystal semiconductor layer , at least an upper portion of the third single-crystal semiconductor layer containing a p-type impurity and phosphorus in a concentration higher than the concentration of the p-type impurity, at least part of the third single-crystal semiconductor layer functioning as an emitter.

It has been found experimentally that if the third single-crystal semiconductor layer contains a p-type impurity, diffusion of a p-type impurity, for example, boron, in the second single crystal layer is suppressed. Therefore, with the above construction, the p-type impurity concentration distribution is properly maintained in the second single-crystal semiconductor layer functioning as the base layer. The upper portion of the third single-crystal semiconductor layer, which functions as the n-type emitter, contains phosphorus in a concentration higher than the concentration of the p-type impurity in this portion. Thus, the function as the bipolar transistor is maintained.

The concentration of the p-type impurity in the upper portion of the third single-crystal semiconductor layer may be equal to or higher than the concentration of the p-type impurity in the second single-crystal semiconductor layer. This further ensures suppression of diffusion of the p-type impurity in the second single-crystal semiconductor layer.

The first single-crystal semiconductor layer may be a Si layer, the second single-crystal semiconductor layer may be a SiGe or SiGeC layer, and the third single-crystal semiconductor layer may be a Si layer. This enables attainment of a Si/SiGe or Si/SiGeC heterobipolar transistor excellent in electric characteristics such as high-frequency characteristics.

The first method for fabricating a semiconductor device of the present invention includes the steps of: (a) epitaxially growing a p-type second single-crystal semiconductor layer functioning as a base layer on an n-type first single-crystal semiconductor layer functioning as a collector layer on a substrate; (b) epitaxially growing a third single-crystal semiconductor layer on the second single-crystal semiconductor layer; (c) depositing a semiconductor layer on the third single-crystal semiconductor layer, the semiconductor layer including a bottom portion containing phosphorus in a concentration equal to or lower than a concentration permitting phosphorus to be diffused into the third single-crystal semiconductor layer in a concentration as high as the solid-solubility limit for the third single-crystal semiconductor layer, and an upper portion containing phosphorus in a concentration higher than that in the bottom portion; and (d) performing heat treatment for diffusing phosphorus in the semiconductor layer so that the upper portion of the third single-crystal semiconductor layer is doped with phosphorus in a concentration equal to or lower than the solid-solubility limit, to form an emitter of a bipolar transistor.

By the above method, during the heat treatment in the step (d), phosphorus is suppressed from diffusing into the third single-crystal semiconductor layer in a concentration exceeding the solid-solubility limit from the bottom portion of the semiconductor layer such as an amorphous silicon layer or a polysilicon layer. This suppresses generation of point defects in the third single-crystal semiconductor layer, and thus enables attainment of a bipolar transistor including a base having a good p-type impurity concentration distribution.

In the step (c), the concentration of phosphorus introduced into the semiconductor layer may be increased in stages or sequentially toward the upper portion.

The second method for fabricating a semiconductor device of the present invention includes the steps of: (a) epitaxially growing a p-type second single-crystal semiconductor layer functioning as a base layer on an n-type first single-crystal semiconductor layer functioning as a collector layer on a substrate; (b) epitaxially growing a third single-crystal semiconductor layer on the second single-crystal semiconductor layer; (c) doping at least an upper portion of the third single-crystal semiconductor layer with a p-type impurity; (d) forming a semiconductor layer containing phosphorus on the third single-crystal semiconductor layer; and (e) performing heat treatment for diffusing phosphorus in the semiconductor layer so that the upper portion of the third single-crystal semiconductor layer is doped with phosphorus in a concentration higher than the concentration of the p-type impurity introduced in the step (c), to form an emitter of a bipolar transistor.

By the above method, due to the existence of the p-type impurity introduced into the upper portion of the third single-crystal semiconductor layer in the step (c), the p-type impurity in the second single-crystal semiconductor layer is prevented from diffusing during the subsequent heat treatment, as was found out experimentally. This enables attainment of a bipolar transistor including a base having a good p-type impurity concentration distribution.

The step (c) may be performed simultaneously with the step (b) by epitaxially growing the third single-crystal semiconductor layer while being doped with the p-type impurity, or may be performed after the step (b) by implanting ions of the p-type impurity in the third single-crystal semiconductor layer.

The method may further include the steps of: forming an insulating layer on the third single-crystal semiconductor layer after the step (b) and before the step (c); and forming a semiconductor layer containing a p-type impurity on the insulating layer, wherein the step (c) is performed by introducing the p-type impurity into the third single-crystal semiconductor layer from the semiconductor layer via the insulating layer.

BEST MODE FOR CARRYING OUT THE INVENTION

First Embodiment

Figure 1:
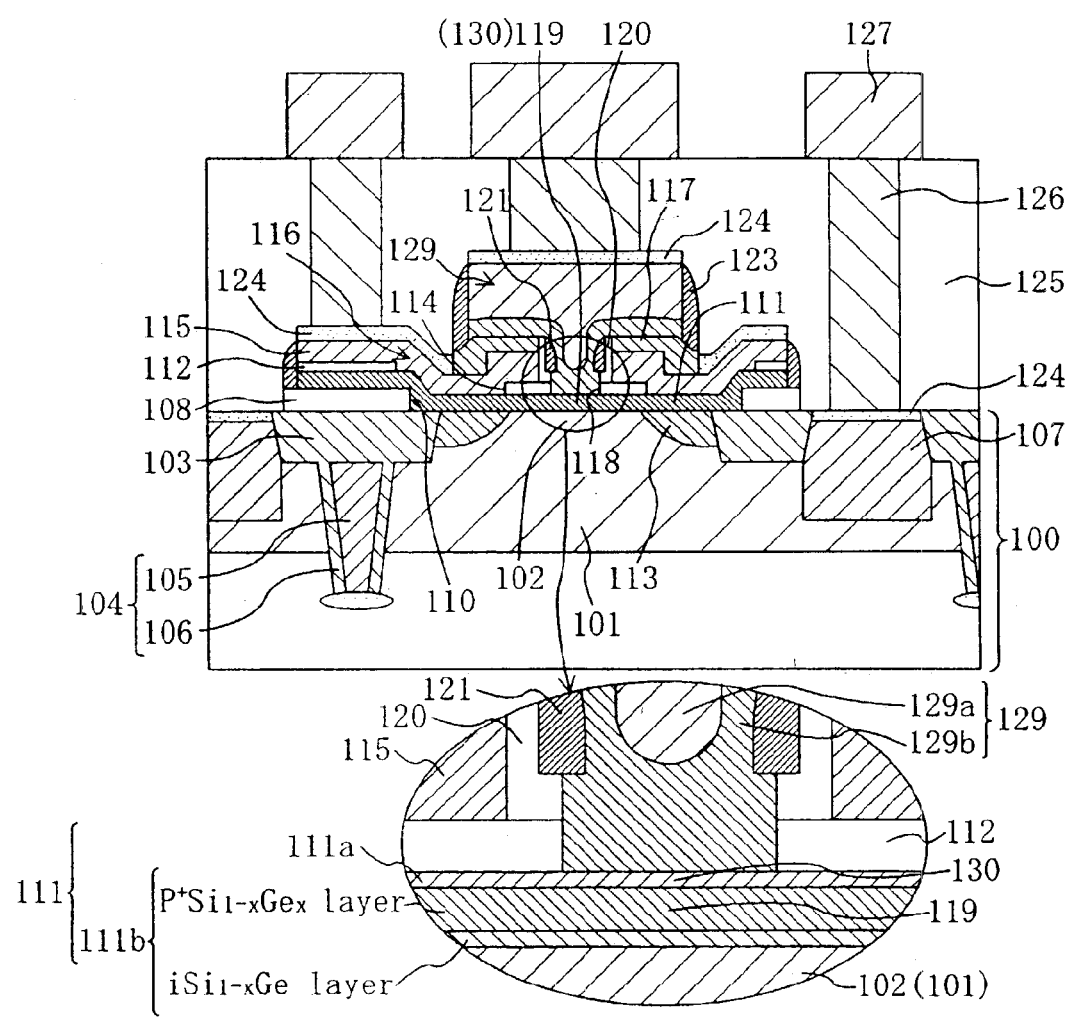
FIG. 1 is a cross-sectional view of a HBT as a semiconductor device of the first embodiment of the present invention.

FIG. 1 is a cross-sectional view of a semiconductor device of the first embodiment of the present invention, which is a heterobipolar transistor (HBT). Only the structure of the HBT is shown in FIG. 1. However, in many cases, a CMOS device is also mounted on the common substrate. In these cases, assume that MIS transistors of the CMOS device exist in a region not shown.

As shown in FIG. 1, the upper portion of a Si substrate 100 using the (001) face as the principal plane is occupied by a retrograde well 101 having a depth of 1 μm containing an n-type impurity such as phosphorus introduced by epitaxial growth, ion implantation, or the like. The concentration of the n-type impurity in a region near the surface of the Si substrate 100 is set to be about $1 \times 10^{17}$ atoms.cm$^{-3}$. As device isolation, provided are a shallow trench 103 with silicon oxide buried therein and a deep trench 104 constructed of an undoped polysilicon film 105 and a silicon oxide film 106 surrounding the undoped polysilicon film 105. The depth of the trenches 103 and 104 are about 0.35 μm and about 2 μm, respectively.

A collector layer 102 is formed in the region of the Si substrate 100 sandwiched by the adjacent trenches 103. An n$^+$ collector lead layer 107 for contacting with an electrode of the collector layer 102 via the retrograde well 101 is formed in a region of the Si substrate 100 isolated from the collector layer 102 by the shallow trench 103.

A first buried oxide film 108 having a thickness of about 30 nm, which has a collector opening 110, is formed on the Si substrate 100. A Si$_{1-x}$Ge$_x$ layer 111b, composed of an undoped layer (i—Si$_{1-x}$Ge$_x$ layer) having a thickness of about 30 nm and a p-type impurity doped layer (p$^+$ Si$_{1-x}$Ge$_x$ layer) having a thickness of about 60 nm, is formed over the exposed portion of the Si substrate 100 in the collector opening 110 and the first buried oxide film 108. A Si cap layer 111a having a thickness of about 30 nm is then formed on the layer 111b. The Si cap layer 111a and the Si$_{1-x}$Ge$_x$ layer 111b constitute a Si/Si$_{1-x}$Ge$_x$ layer 111 (see the partial enlarged view). The portion of the Si/Si$_{1-x}$Ge$_x$ layer 111 located on the exposed surface of the Si substrate 100 in the collector opening 110 has a single-crystal structure according to the crystal structure of the underlying Si substrate 100, while the portion thereof located on the first buried oxide film 108 has a polycrystal structure. Mainly the lower part of the center portion (region under a base opening 118 to be described later) of the Si$_{1-x}$Ge$_x$ layer 111b functions as an internal base 119, and the center portion of the Si cap layer 111a functions as an emitter layer. Most of the Si$_{1-x}$Ge$_x$ layer is doped with a p-type impurity such as boron (B) in a concentration of about $2 \times 10^{18}$ atoms.cm$^{-3}$.

A second buried oxide film 112 having a thickness of about 30 nm is formed on the Si/Si$_{1-x}$Ge$_x$ layer 111 and the first buried oxide film 108 as an etch stopper. The second buried oxide film 112 has base junction openings 114 and a base opening 118. A p$^+$ polysilicon layer 115 having a thickness of about 150 nm is formed to bury the base junction openings 114 and expands over the second buried oxide film 112, and a third buried oxide film 117 is formed on the p$^+$ polysilicon layer 115. The portion of the Si/Si$_{1-x}$Ge$_x$ layer 111 excluding the region under the base opening 118 and the p$^+$ polysilicon layer 115 constitute an external base 116.

An opening is formed through the portion of the p$^+$ polysilicon layer 115 and the portion of the third buried oxide film 117 located above the base opening 118 of the second buried oxide film 112. A fourth buried oxide film 120 having a thickness of about 30 nm is formed on each side face of the p$^+$ polysilicon layer 115, and a sidewall 121 made of polysilicon having a thickness of about 100 nm is formed on the fourth buried oxide film 120.

A feature of this embodiment is an emitter lead electrode 129 composed of an n⁻ polysilicon layer 129b having a thickness of about 100 nm and an n⁺ polysilicon layer 129a having a thickness of about 200 nm, formed to bury the base opening 118 and expand over the third buried oxide film 117 (see the partial enlarged view). Thus, the n⁺ polysilicon layer 129a is not directly formed on the Si cap layer 111a, but the n⁻ polysilicon layer 129b is interposed therebetween. In this way, the Si cap layer 111a is suppressed from being doped with an excessively high concentration of phosphorus (P). In this embodiment, the Si cap layer 111a is doped with phosphorus (P) diffused from the n⁺ polysilicon 129a in a distribution from about $7 \times 10^{20}$ atoms.cm⁻³ to about $1 \times 10^{20}$ atoms.cm⁻³ in the depth direction of the substrate.

The fourth buried oxide film 120 electrically isolates the p⁺ polysilicon 115 from the emitter lead electrode 129, and also blocks diffusion of an impurity from the p⁺ polysilicon 115 to the emitter lead electrode 129. Likewise, the third buried oxide film 117 isolates the top surface of the p³⁰ polysilicon layer 115 from the emitter lead electrode 129. Sidewalls 123 cover the outer side faces of the emitter lead electrode 129 and the p⁺ polysilicon layer 115.

Figure 12:
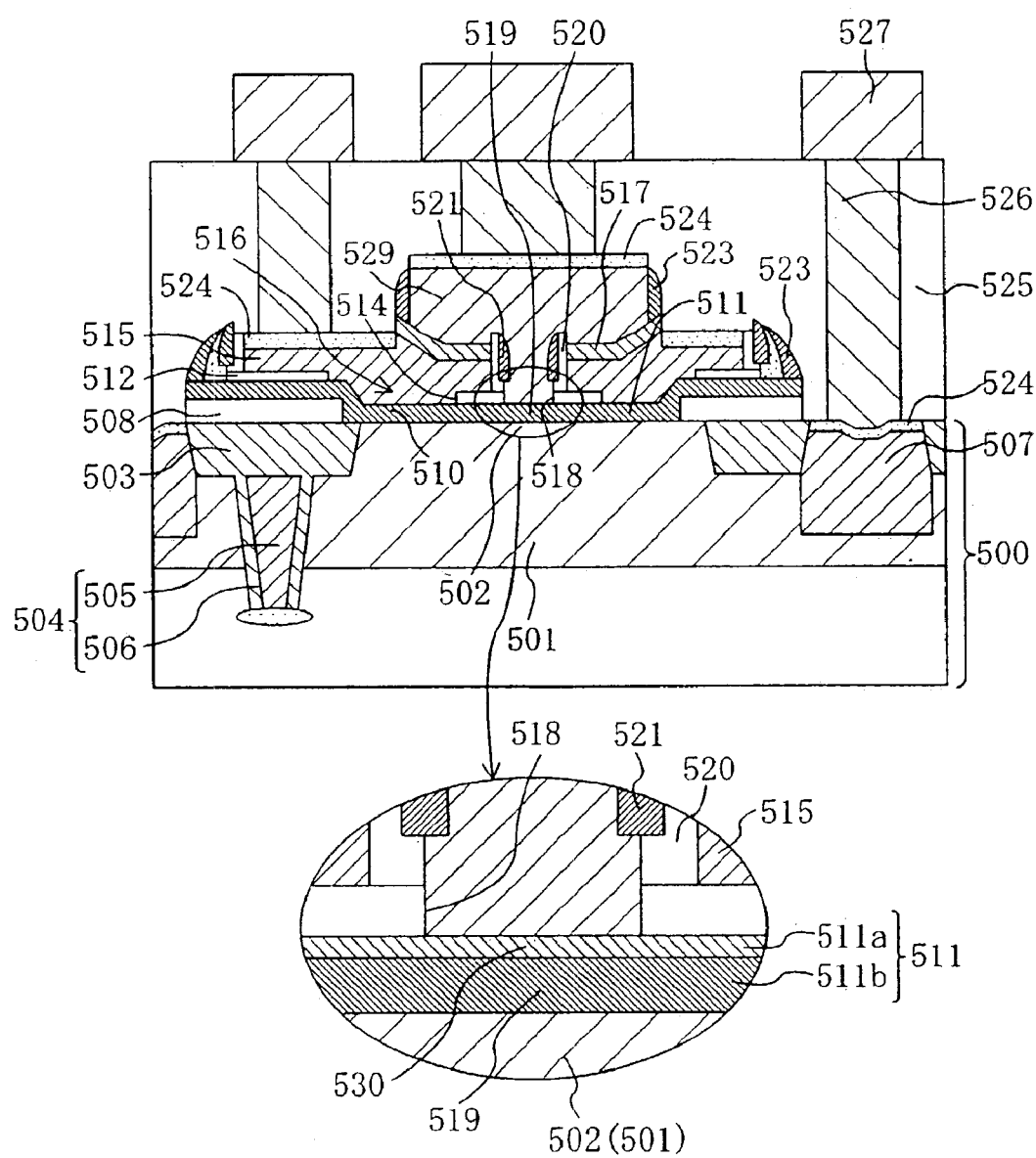
FIG. 12 is a cross-sectional view of a conventional bipolar transistor.

Ti silicide layers 124 are formed on the collector lead layer 107, the p⁺ polysilicon layer 115, and the emitter lead electrode 129. The structure of the outer side faces of the p⁺ polysilicon layer 115 is different from the structure in the conventional HBT shown in FIG. 12. This is due to the difference in the patterning order of the p⁺ polysilicon layer 115 and the emitter lead electrode 129.

The entire substrate is covered with an interlayer insulating film 125. Connection holes are formed through the interlayer insulating film 125 to reach the Ti silicide layers 124 on the n⁺ collector lead layer 107, the p⁺ polysilicon layer 115 as part of the external base, and the emitter lead electrode 129. W plugs 126 bury the connection holes, and metal interconnections 127 connected to the W plugs 126 extend on the interlayer insulating film 125.

The thicknesses of the layers specified above represent typical values, and may be appropriately changed depending on the type and use of the HBT.

The structure of the emitter-base junction shown in the partial enlarged view in FIG. 1 will be described. The region of the $Si_{1-x}Ge_x$ layer 111b located under the base opening 118 functions as the internal base (intrinsic base) 119. The region of the Si cap layer 111a located immediately under the base opening 118, into which boron has been introduced by diffusion from the emitter lead electrode 129, functions as an emitter 130.

The portion of the $Si/Si_{1-x}Ge_x$ layer 111 excluding the region under the base opening 118 and the p⁺ polysilicon layer 115 constitute the external base 116. Note however that in the partial enlarged view, the portion of the $Si/Si_{1-x}Ge_x$ layer 111 excluding the region under the base opening 118 functions as the external base 116.

Figure 13:
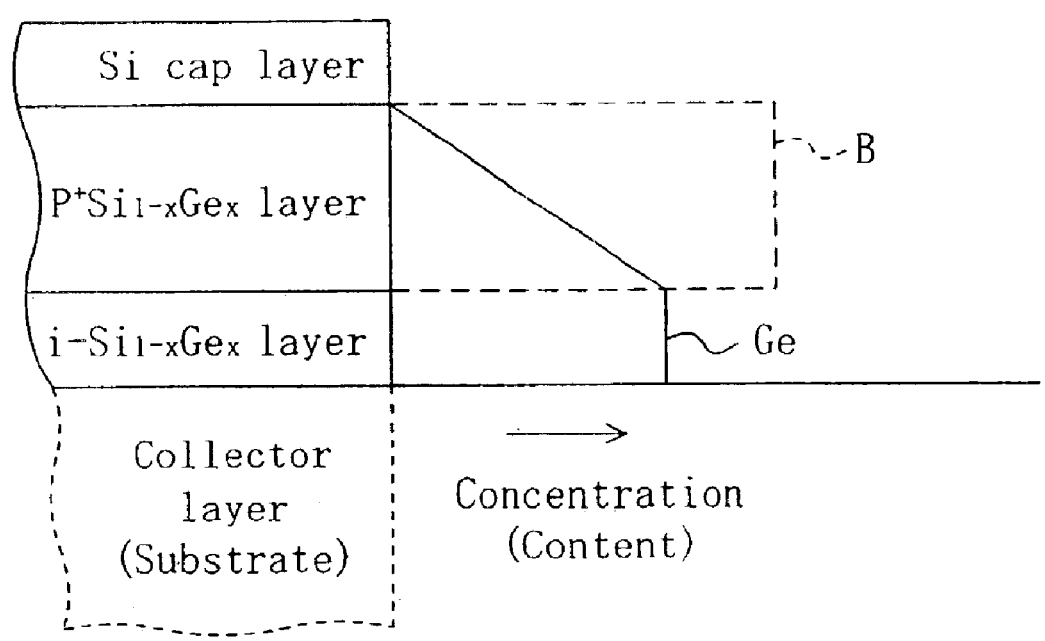
FIG. 13 is an illustration of a conventional cross-sectional structure of a Si cap layer, a p$^+$ Si$_{1-x}$Ge$_x$ layer, and an i—Si$_{1-x}$Ge$_x$ layer, together with distributions of the B concentration and the Ge content.
Figure 14:
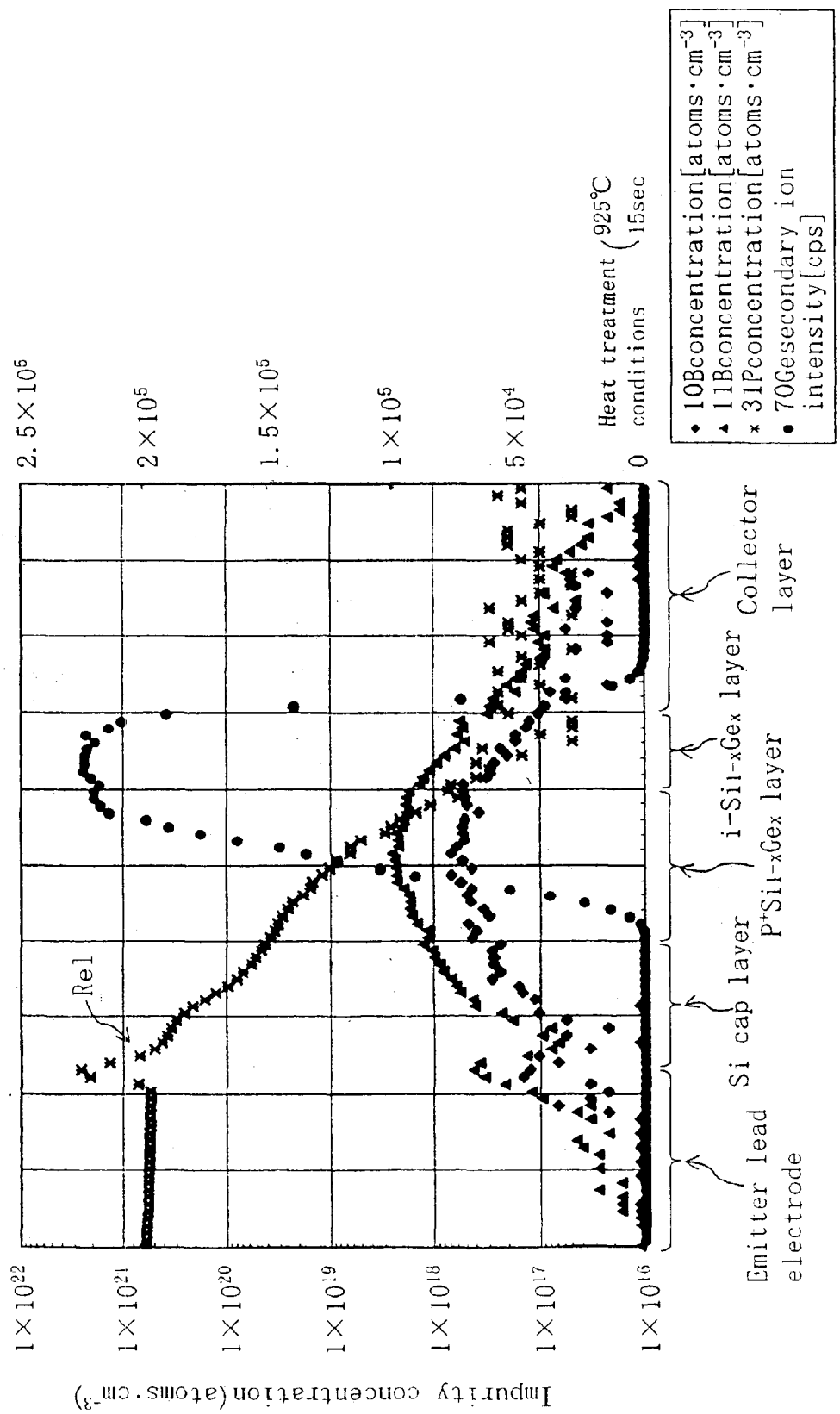
FIG. 14 is a view showing SIMS measurement data on the concentration distributions of phosphorus (P) and boron (B) and the distribution of Ge secondary ion intensity in an emitter-base region of a conventional Si/SiGe heterobipolar transistor.

By construction described above, provided is the Si/SiGe NPN heterobipolar transistor including the n⁺-type emitter 130 made of Si single crystal, the p⁺-type internal base 119 mainly made of $Si_{1-x}Ge_x$ single crystal, and the collector layer 102 made of Si single crystal. Note however that the emitter/base/collector are partitioned from one another, not by the boundaries of Si/SiGe crystals, but by changes of the conductivity type of impurities. Therefore, to be precise, the boundaries of the emitter/base/collector vary depending on the concentration profiles of the impurities. In particular, the concentration profile of boron (P) as a p-type impurity in the internal base 119 plays the most important role. In view of this, the deposition of the $Si_{1-x}Ge_x$ layer 111b is performed as in the prior art technique described above with reference to FIG. 13.

Next, a fabrication process for attaining the structure shown in FIG. 1 will be described with reference to FIGS. 2(a) to 5(b). FIGS. 2(a) to 5(b) are cross-sectional views illustrating the fabrication process of the Si/SiGe HBT of the first embodiment. A CMOS device may also be formed on the common substrate, or only the HBT may be formed.

Figure 2A:
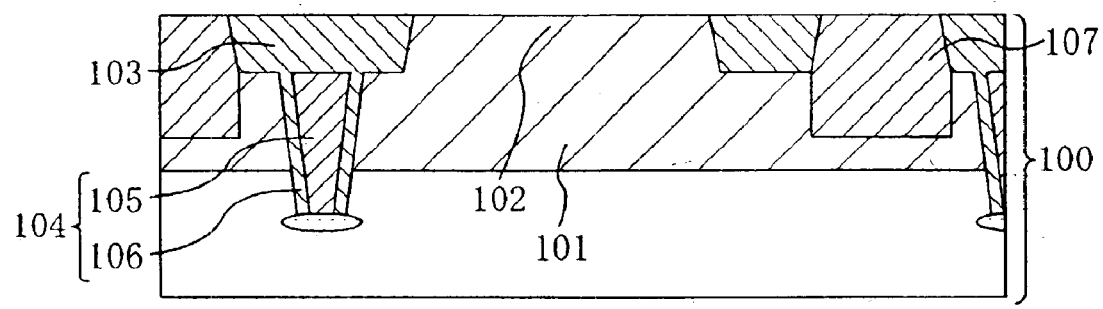
FIGS. 2(a) and 2(b) are cross-sectional views illustrating steps of forming a Si/Si$_{1-x}$Ge$_x$ layer in a collector opening in the fabrication process of the semiconductor device of the first embodiment.

First, in the step shown in FIG. 2(a), a Si single crystal layer is epitaxially grown, while being doped with an n-type impurity, on the upper portion of the Si substrate 100 using the (001) face as the principal plane. Alternatively, high-energy ion implantation is performed after the epitaxial growth of a Si single crystal layer. In either case, the n-type retrograde well 101 having a depth of about 1 μm is formed in this step. The retrograde well 101 may otherwise be formed by performing ion implantation for part of the Si substrate 100 without involving the epitaxial growth. In this step, the concentration of the n-type impurity in the region of the Si substrate 100 near the surface thereof, which is to be used as the collector layer of the HBT, is set to be about $1 \times 10^{17}$ atoms.cm⁻³.

Thereafter, for device isolation, formed are the shallow trench 103 with silicon oxide buried therein and the deep trench 104 constructed of the undoped polysilicon film 105 and the silicon oxide film 106 surrounding the undoped polysilicon film 105. The depths of the trenches 103 and 104 are set at about 0.35 μm and about 2 μm, respectively. The region of the Si substrate 100 sandwiched by the adjacent shallow trenches 103 functions as the collector layer 102. The n⁺ collector lead layer 107 for contacting with the collector electrode is formed in a region of the Si substrate 100 isolated from the collector layer 102 by the shallow trench 103.

Figure 2B:
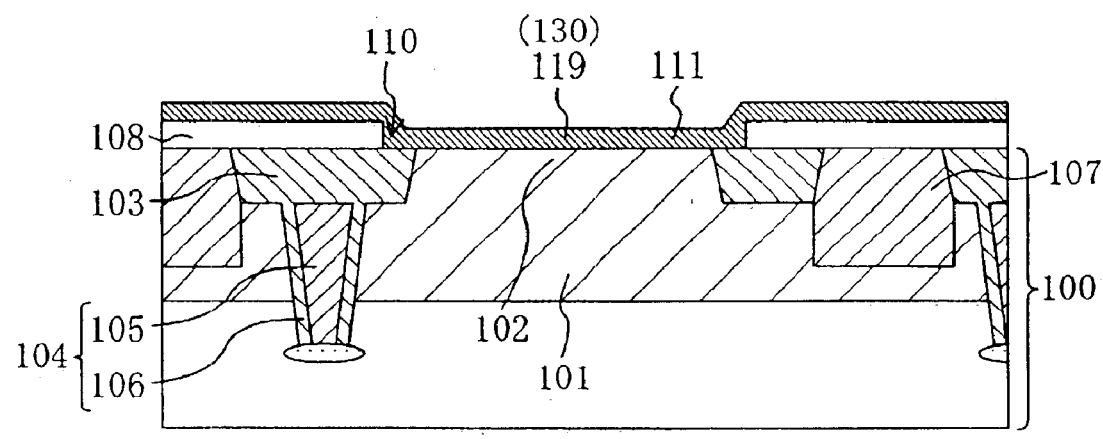

In the step shown in FIG. 2(b), the first buried oxide film 108 having a thickness of about 30 nm is formed on the wafer by chemical vapor deposition (CVD) using tetra-ethoxy silane (TEOS) and oxygen at a treating temperature of 680° C. The collector opening 110 is then formed through the first buried oxide film 108 by wet etching with hydrofluoric acid or the like. The portion of the Si substrate 100 exposed in the collector opening 110 is treated with a mixture of anmonium hydroxide and hydrogen peroxide, and then covered with a protection oxide film having a thickness of about 1 nm. The resultant wafer is then put in a chamber of a UHV-CVD apparatus. Inside the chamber, the protection oxide film is removed by heat treatment in a hydrogen atmosphere, and then disilane ($Si_2H_6$) and germane ($GeH_4$) are introduced into the chamber while heating to 550° C., to epitaxially grow the undoped layer (i—$Si_{1-x}Ge_x$ layer) having a thickness of about 30 nm shown in the partial enlarged view in FIG. 1 selectively over the portion of the Si substrate 100 exposed in the collector opening 110 and the first buried oxide film 108. Subsequently, a gas containing diborane ($B_2H_6$) for doping in addition to disilane ($Si_2H_6$) and germane ($GeH_4$) is introduced into the chamber while heating to 550° C., to epitaxially grow the p⁺ $Si_{1-x}Ge_x$ layer having a thickness of about 60 nm on the i—$Si_{1-x}Ge_x$ layer. Thus, the $Si_{1-x}Ge_x$ layer 111b having a total thickness of about 90 nm is formed. After the formation of the $Si_{1-x}Ge_x$ layer 111b, the gas to be supplied sequentially into the chamber is changed to disilane, to epitaxially grow the Si cap layer having a thickness of about 30 nm on the p⁺ $Si_{1-x}Ge_x$ layer of the $Si_{1-x}Ge_x$ layer 111b. The $Si_{1-x}Ge_x$ layer 111b and the Si cap layer 111a constitute the $Si/Si_{1-x}Ge_x$ layer 111. The boron (B) concentration in the p⁺

$Si_{1-x}Ge_x$ layer is $2\times10^{18}$ atoms.cm$^{-3}$. No impurity is introduced into the Si cap layer 111a. Mainly the lower part of the center portion of the $Si_{1-x}Ge_x$ 111b functions as the internal base 119.

Figure 3A:
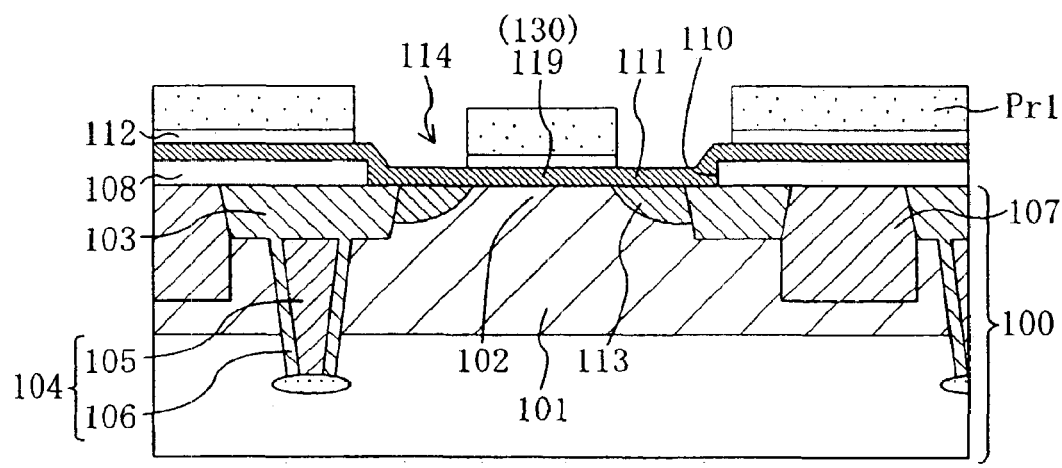
FIGS. 3(a) and 3(b) are cross-sectional views illustrating steps of forming a base opening through a p$^{30}$ polysilicon layer in the fabrication process of the semiconductor device of the first embodiment.

In the step shown in FIG. 3(a), the second buried oxide film 112 having a thickness of 30 nm as an etch stopper is formed on the wafer. Thereafter, using a resist mask Pr1 formed on the second buried oxide film 112, the second buried oxide film 112 is patterned by dry etching, to form the base junction openings 114. As a result, the center portion of the $Si/Si_{1-x}Ge_x$ layer 111 is covered with the second buried oxide film, and part of the $Si/Si_{1-x}Ge_x$ layer 111 and part of the first buried oxide film 108 are exposed in the base junction openings 114. Using the resist mask Pr1 used for the formation of the base junction openings 114, a p-type impurity such as boron (B) is introduced by ion implantation to form junction leak prevention layers 113 having a boron concentration of about $3\times10^{17}$ atoms.cm$^{-3}$ in a portion near the surface for suppressing influence of stress at the active region/isolation junctions.

Figure 3B:
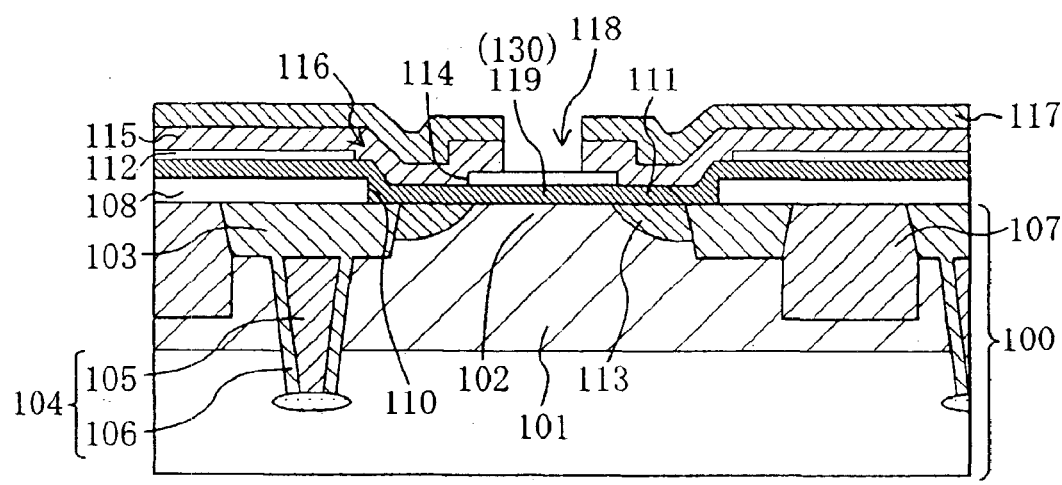

In the step shown in FIG. 3(b), the p$^+$ polysilicon layer 115 having a thickness of about 150 nm doped with boron in a high concentration of $1\times10^{20}$ atoms.cm$^{-3}$ or more, and subsequently, the third buried oxide film 117 having a thickness of about 100 nm are deposited on the wafer by CVD. The third buried oxide film 117 and the p$^+$ polysilicon layer 115 are then patterned by dry etching, to form the base opening 118 through the center portions of the third buried oxide film 117 and the p$^+$ polysilicon layer 115 to reach the second buried oxide film 112. The base opening 118 is narrower than the center portion of the second buried oxide film 112, and thus does not overlap the base junction openings 114. By this step, formed is the external base 116 constructed of the p$^+$ polysilicon layer 115 and the portion of the $Si/Si_{1-x}Ge_x$ layer 111 excluding the center portion thereof. In this embodiment, both side faces of the third buried oxide film 117 and the p$^+$ polysilicon layer 115 as viewed from the figure are left non-etched. This minimizes residues from attaching to etched sidewalls.

Figure 4A:
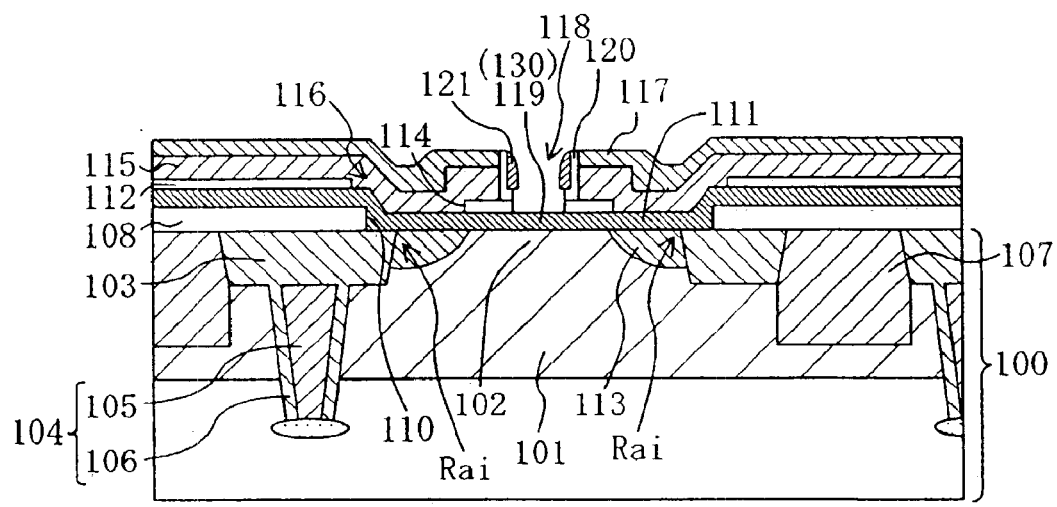
FIGS. 4(a) and 4(b) are cross-sectional views illustrating steps of forming an n$^+$ polysilicon layer in the base opening in the fabrication process of the semiconductor device of the first embodiment.

In the step shown in FIG. 4(a), the fourth buried oxide film 120 having a thickness of about 30 nm and a polysilicon film having a thickness of about 150 nm are sequentially deposited over the entire surface of the wafer by CVD, and the etched back by anisotropic dry etching, to form the fourth buried oxide films 120 on the side faces of the p$^+$ polysilicon layer and the third buried oxide film 117 and the sidewalls 121 made of polysilicon on the fourth buried oxide films 120. Wet etching is then performed with hydrofluoric acid or the like to remove exposed portions of the second buried oxide film 112 and the fourth buried oxide film 120. By this treatment, the Si cap layer as the upper part of the $Si/Si_{1-x}Ge_x$ layer 111 is exposed in the base opening 118. In addition, since wet etching is isotropic, the second buried oxide film 112 and the fourth buried oxide film 120 are also etched laterally. As a result, the size of the base opening 118 is widened.

Figure 4B:
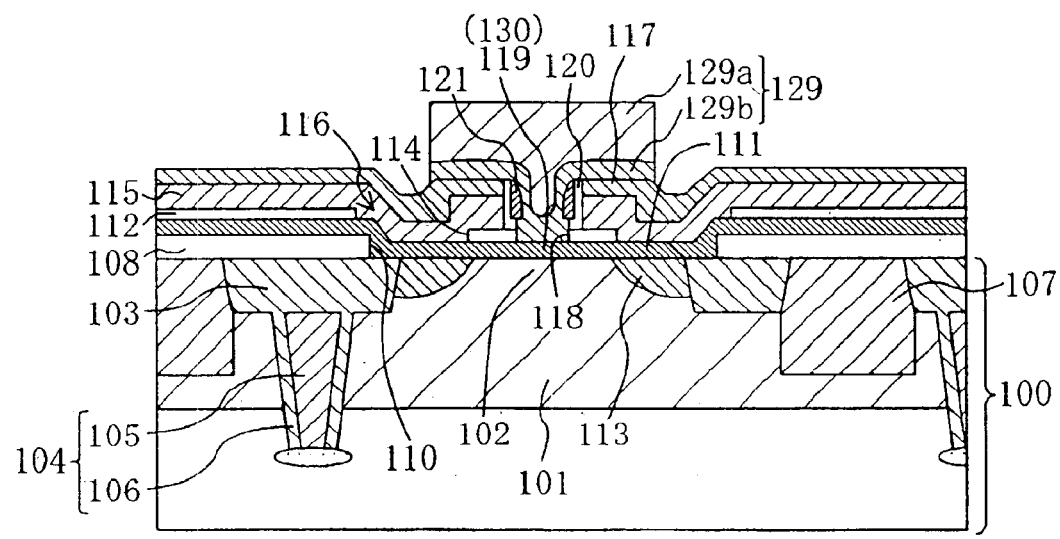

In the step shown in FIG. 4(b), the n$^-$ polysilicon layer 129b having a thickness of about 100 nm (in an amorphous state when deposited) and the n$^+$ polysilicon layer 129a having a thickness of about 200 nm are sequentially deposited, and then patterned by dry etching, to form the emitter lead electrode 129. By in-situ doping during the deposition of the polysilicon film, the n$^+$ polysilicon layer 129a is doped with phosphorus (P) in a concentration of about $7\times10^{20}$ atoms.cm$^{-3}$, and the n$^-$ polysilicon layer 129b is doped with phosphorus (P) in a concentration of about $7\times10^{19}$ atoms.cm$^{-3}$. Thereafter, by heat treatment at 925° C. for 15 seconds the phosphorus (P) is diffused from the n$^-$ polysilicon layer 129b into the Si cap layer 111a, to allow the Si cap layer 111a to be doped with phosphorus (P) in a distribution from about $2\times10^{19}$ atoms.cm$^{-3}$ to about $1\times10^{17}$ atoms.cm$^{-3}$ toward the depth direction of the substrate. In this way, the emitter 130 is formed.

Figure 5A:
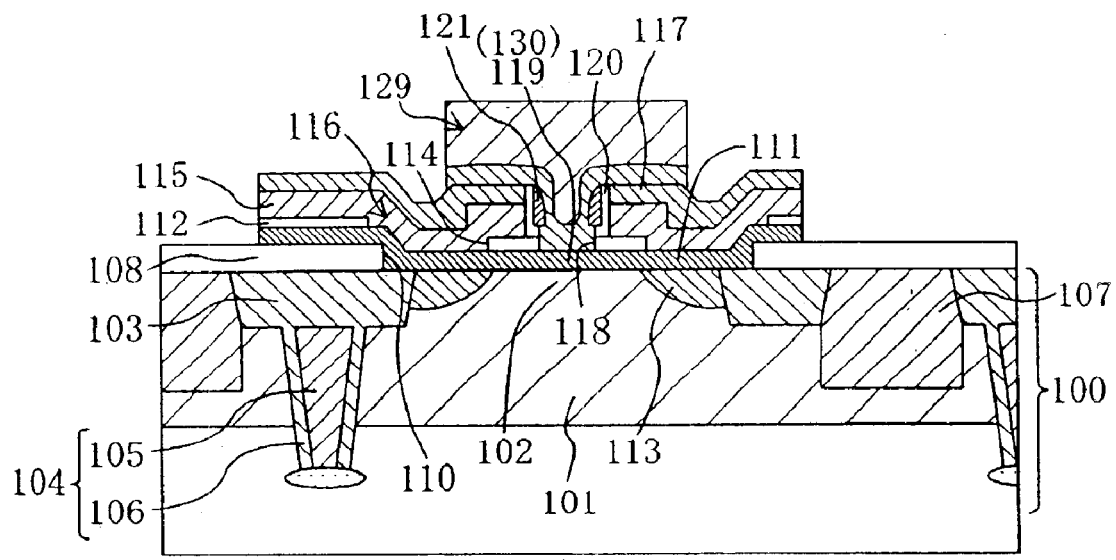
FIGS. 5(a) and 5(b) are cross-sectional views illustrating steps of patterning end faces of the p$^+$ polysilicon layer in the fabrication process of the semiconductor device of the first embodiment.

In the step shown in FIG. 5(a), the third buried oxide film 117, the p$^+$ polysilicon layer 115, and the second buried oxide film 112 are patterned to determine the shape of the external base 116.

Figure 5B:
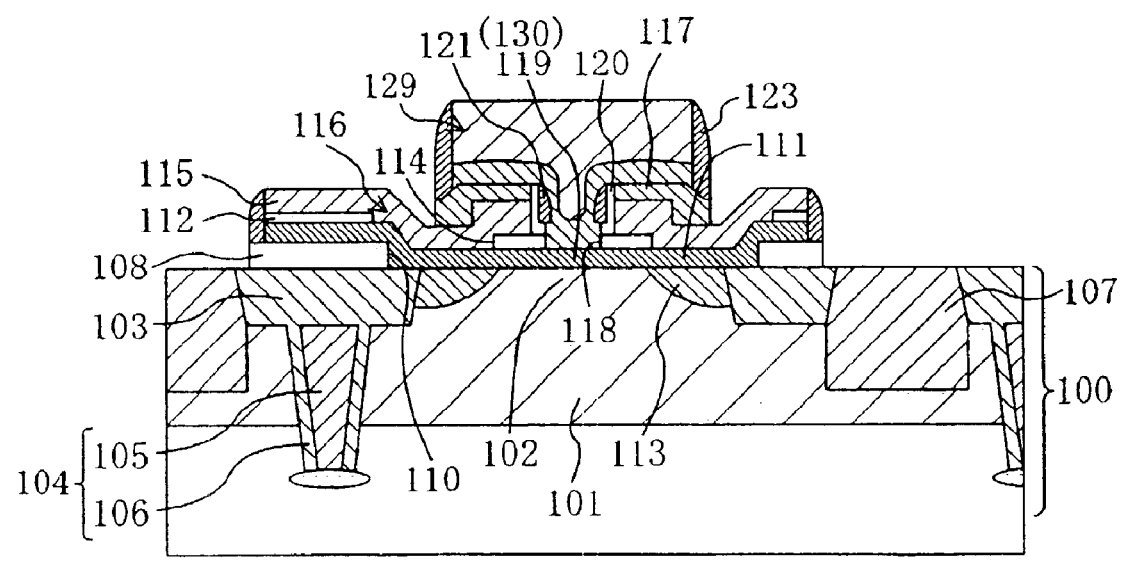

In the step shown in FIG. 5(b), an oxide film is deposited on the wafer to the thickness of about 120 nm and then dry-etched to form the sidewalls 123 on the side faces of the emitter lead electrode 129 and the p$^+$ polysilicon layer 115. By this dry etching (over-etching), the exposed portions of the first buried oxide film 108 are removed. Thus, the surfaces of the emitter lead electrode 129, the p$^+$ polysilicon layer 115, and the n$^+$ collector lead layer 107 are exposed.

Subsequently, to obtain the structure shown in FIG. 1, the following process steps are performed. First, a Ti film having a thickness of about 40 nm is deposited over the entire surface of the wafer by sputtering, and then RTA (rapid thermal annealing) is performed at 675° C. for 30 seconds, to form the Ti silicide layers 124 on the exposed surfaces of the emitter lead electrode 129, the p$^+$ polysilicon layer 115, and the n$^+$ collector lead layer 107. After selective removal of only unreacted portions of the Ti film, annealing is performed for changing the crystal structure of the Ti silicide films 124.

The interlayer insulating film 125 is then formed over the entire surface of the wafer, and then the connection holes are formed through the interlayer insulating film 125 to reach the Ti silicide layers 124 of the emitter lead electrode 129, the p$^+$ polysilicon layer 115, and the n$^+$ collector lead layer 107. The W plugs 126 are then formed by filling the connection holes with W films. An aluminum alloy film is then deposited over the entire surface of the wafer, and patterned to form the metal interconnections 127 connected to the W plugs 126 and extending on the interlayer insulating film 125.

By the process steps described above, attained is the HBT having the structure shown in FIG. 1, that is, the HBT including the collector made of the phosphorus (P) doped well layer (retrograde well 101) in the Si substrate 100, the base made of the boron (B) doped p$^+$ $Si_{1-x}Ge_x$ layer, and the emitter made of the phosphorus (P) doped Si cap layer 111a.

In the HBT and the fabrication method thereof of this embodiment, the p$^-$ polysilicon layer 129b containing phosphorus (P) in a low concentration was interposed between the p$^+$ polysilicon layer 129a containing phosphorus (P) in a high concentration and the Si cap layer 111a. By this construction, it is possible to suppress spread of the boron (B) concentration distribution in the internal base 119 due to diffusion of phosphorus (P) into the Si cap layer 111a in a high concentration.

Figure 6:
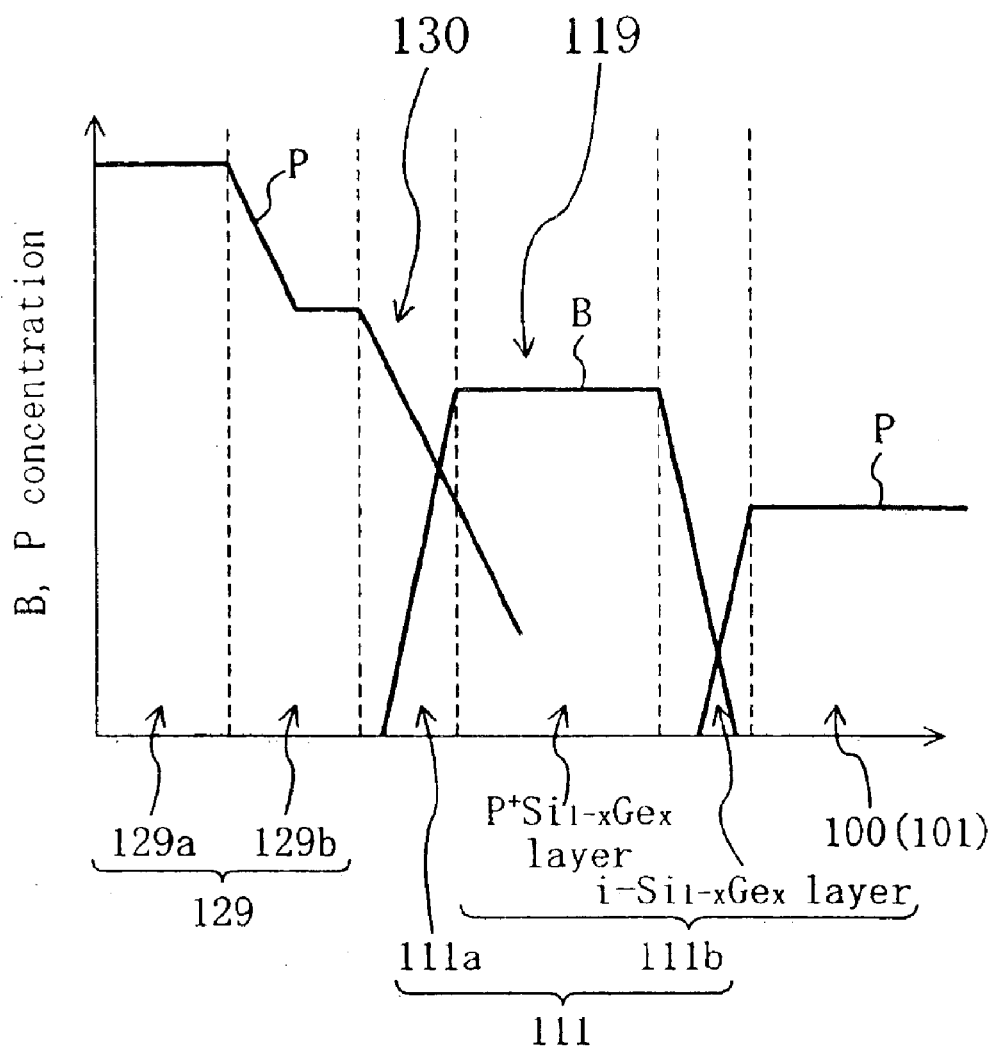
FIG. 6 is a schematic illustration of the concentration distributions of phosphorus (P) and boron (B) along the vertical section from an emitter lead electrode to a Si substrate in the first embodiment.

FIG. 6 is a schematic illustration of the concentration distributions of phosphorus (P) and boron (B) along the vertical section from the emitter lead electrode 129 to the Si substrate 100 in this embodiment. As shown in FIG. 6, the phosphorus (P) concentration is sufficiently high to allow activation in the n$^+$ polysilicon layer 129a of the emitter lead electrode 129, so that the low-resistance characteristic of the emitter lead electrode 129 required to attain desired characteristics of the HBT is secured. As for the emitter 130 composed of the upper portion of the Si cap layer 111a, it is doped with phosphorus (P) in a concentration that is equal to or less than the solid-solubility limit and yet sufficiently high to function as the emitter. In the p$^+$ Si$_{1-x}$Ge$_x$ layer functioning as the internal base 119, the boron (B) concentration distribution is kept sharp without widely spreading into the Si cap layer 111a and the i—Si$_{1-x}$Ge$_x$ layer. The attainment of the impurity concentration distributions as described above was confirmed by performing simulation as follows.

Figure 7:
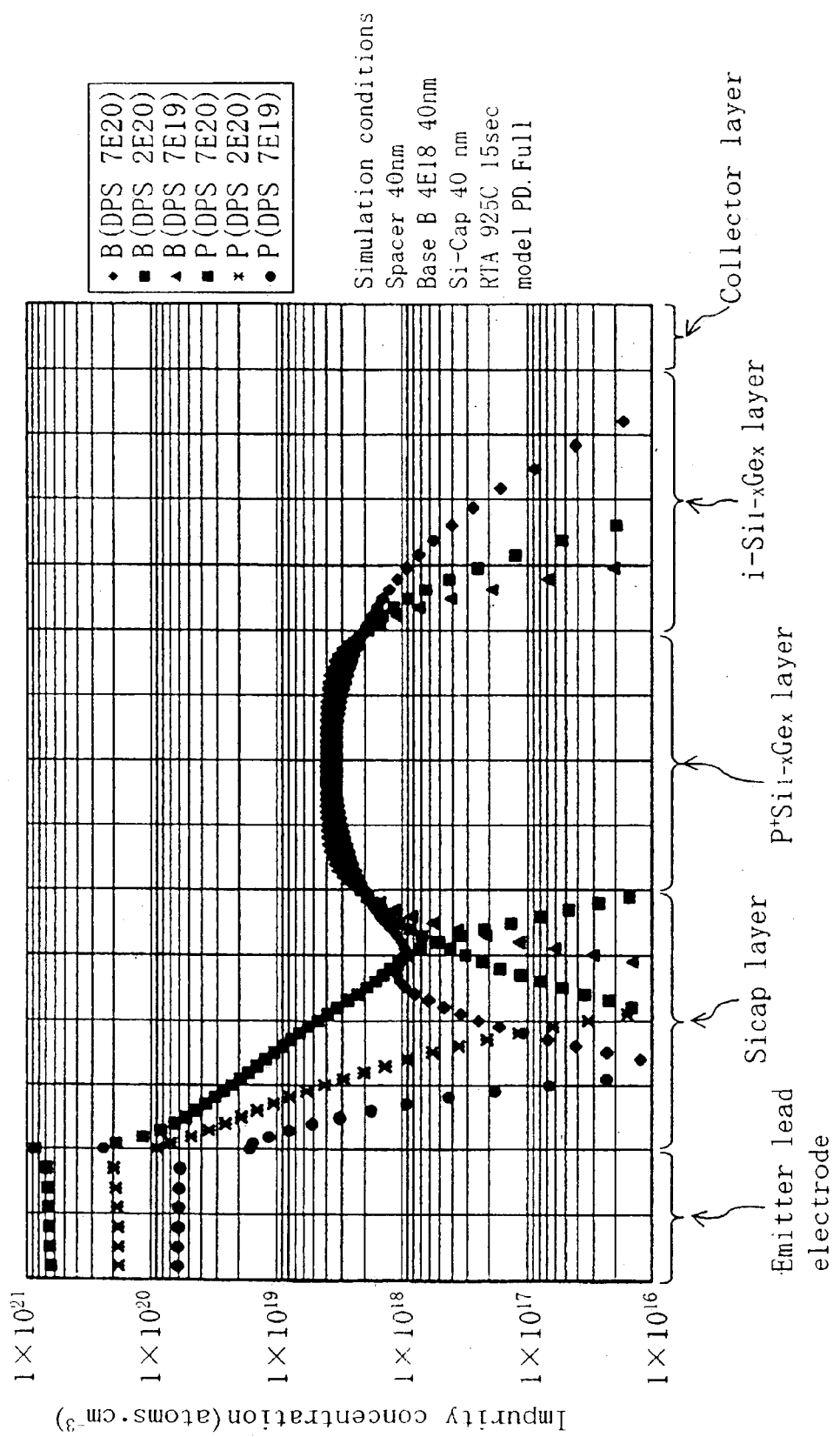
FIG. 7 is a view showing simulation results on the dependency of the accelerated diffusion of boron (B) in a p$^+$ Si$_{1-x}$Ge$_x$ layer on the phosphorus (P) concentration in a polysilicon layer.

FIG. 7 is a view showing the results of simulation conducted to examine how the accelerated diffusion of boron (B) in the p$^+$ Si$_{1-x}$Ge$_x$ layer changes with the concentration of phosphorus (P) in the polysilicon layer constituting the emitter lead electrode 129. In FIG. 7, the x-axis represents the relative depth and the y-axis represents the concentration (atoms.cm$^{-3}$) of phosphorus (P) or boron (B). The conditions set for the simulation are as follows. The thicknesses of the i—Si$_{1-x}$Ge$_x$ layer as a spacer, the p$^+$ Si$_{1-x}$Ge$_x$ layer as the base, and the Si cap layer were set at 40 nm, 40 nm, and 40 nm, respectively, and heat treatment for diffusion was performed at 925° C., for 15 seconds. Note that since it is difficult to simulate the concentration distribution of the impurity diffused in the polysilicon layer, the concentration of the impurity in the polysilicon layer is assumed constant. On the right side of FIG. 7, the phosphorus concentration (atmos.cm$^{-3}$) in the polysilicon layer (DPS) is shown for each of the boron (B) and phosphorus (P) data. For example, data B(DPS 7E20) represents how boron introduced into the p$^+$ Si$_{1-x}$Ge$_x$ layer (internal base) was diffused when the n$^-$ polysilicon layer 129b was doped with phosphorus (P) in a concentration of 7×10$^{20}$ atoms.cm$^{-3}$. Data P(DPS 7E20) represents how phosphorus (P) was diffused into the Si cap layer 111a when the n$^-$ polysilicon layer 129b was doped with the phosphorus (P) in a concentration of 7×10$^{20}$ atoms.cm$^{-3}$.

As shown in FIG. 7, when the polysilicon layer adjacent to the Si cap layer was doped with phosphorus (P) in a concentration of about 7×10$^{20}$ atoms.cm$^{-3}$, the diffusion of boron from the p$^+$ Si$_{1-x}$Ge$_x$ layer was accelerated, resulting in appearing of a peak of boron (B) in the Si cap layer. When the polysilicon layer adjacent to the Si cap layer was doped with phosphorus (P) in a concentration of about 2×10$^{20}$ atoms.cm$^{-3}$, no peak or boron (B) appeared in the Si cap layer, but boron (B) spread into the Si cap layer and the i—Si$_{1-x}$Ge$_x$ layer. In particular, if the thickness of the Si cap layer of the HBT is 10 nm, the top portion of the Si cap layer will contain boron (B) in a concentration of about 3×10$^{17}$ atoms.cm$^{-3}$, which is undesirable. When the polysilicon layer adjacent to the Si cap layer was doped with phosphorus (P) in a concentration as low as about 7×10$^{19}$ atoms.cm$^{-3}$, the diffusion of boron (B) from the p$^+$ Si$_{1-x}$Ge$_x$ layer into the Si cap layer and the i—Si$_{1-x}$Ge$_x$ layer was suppressed, keeping the sharpness of the boron (B) concentration distribution. In this case, the Si cap layer was doped with phosphorus (P) in a concentration of about 2×10$^{19}$ atoms.cm$^{-3}$. This indicates that all the regions were successfully doped with the respective impurities in a concentration necessary for operation of the HBT.

From the above results, it is found that the impurity concentration distribution as shown in FIG. 6 can be attained by depositing the n$^-$ polysilicon layer 129b containing phosphorus (P) in a low concentration of about 7×10$^{19}$ atoms.cm$^{-3}$ directly on the Si cap layer 111a, and depositing the n$^+$ polysilicon layer 129a containing phosphorus (P) in a high concentration of about 7×10$^{20}$ atoms.cm$^{-3}$ on the n$^-$ polysilicon layer 129b, as in the fabrication process described above.

The n$^-$ polysilicon layer 129b preferably contains phosphorus (P) in a concentration equal to or less than the concentration that permits phosphorus (P) to be diffused into the Si cap layer 111a in a concentration as high as the solid-solubility limit. If the Si cap layer 111a is doped with phosphorus (P) in a concentration exceeding the solid-solubility limit, it is presumed that point defects are generated and this facilitates the diffusion of boron. The solid-solubility limit of phosphorus for Si single crystal is about 1×10$^{20}$ atoms.cm$^{-3}$. The solid-solubility limits of phosphorus for various types of semiconductors are unique values determined depending on the material of the semiconductors. If the phosphorus (P) concentration in the n$^-$ polysilicon layer 129b is too low, however, the driving force for diffusion of phosphorus (P) will not be obtained. Therefore, the phosphorus (P) concentration must be high enough to enable diffusion of phosphorus (P) into the Si cap layer 111a. The difference in phosphorus concentration between the top portion of the Si cap layer 111a and the n$^-$ polysilicon layer 129b can be obtained from simulation as shown in FIG. 7, or can be confirmed by measuring samples by SIMS. For example, in the case of the sample providing the P (DPS 7E19) data shown in FIG. 7, the phosphorus (P) concentration in the top portion of the Si cap layer 111a is about 2×10$^{19}$ atoms.cm$^{-3}$, while the phosphorus (P) concentration in the n$^-$ polysilicon layer 129b is about 6×10$^{19}$ atoms.cm$^{-3}$. Considering the results of this and other samples, it is found necessary for the n$^-$ polysilicon layer 129b to contain phosphorus in a concentration about three times as high as the concentration of phosphorus (P) with which the Si cap layer 111a is to be doped, as long as the samples used for the above simulation are concerned. Note however that the above difference in concentration between the two layers varies with the deposition conditions of polysilicon and amorphous silicon (silicon is generally in its amorphous state when deposited), the state of a boundary layer between the n$^-$ polysilicon layer 129b and the underlying Si cap layer 111a, such as whether or nor a naturally oxidized film exists and the thickness of the film if exists, and the like. In other words, the proper range of the phosphorus (P) concentration in the n$^-$ polysilicon layer 129b can be experimentally determined using samples for the fabrication process adopted.

The thickness of the n$^-$ polysilicon layer 129b is determined from the relationship thereof with the phosphorus (P) concentration in the n$^+$ polysilicon layer 129a, and may be any value within the range of thicknesses with which the Si cap layer 111a is prevented from being doped with phosphorus (P) in a concentration exceeding the solid-solubility limit by diffusion from the n$^+$ polysilicon layer 129a and also the entire emitter lead electrode 129 is provided with the necessary low-resistance characteristic.

Three or more polysilicon layers may be formed by interposing a third polysilicon layer containing phosphorus in an intermediate concentration between the n$^+$ polysilicon layer 129a and the n$^-$ polysilicon layer 129b, for example, in place of the two-layer structure described above. Alternatively, the polysilicon layer may be doped with phosphorus in a concentration that continuously changes from a value equal to or less than the solid-solubility limit to a value exceeding the solid-solubility limit.

Second Embodiment

Figure 8:
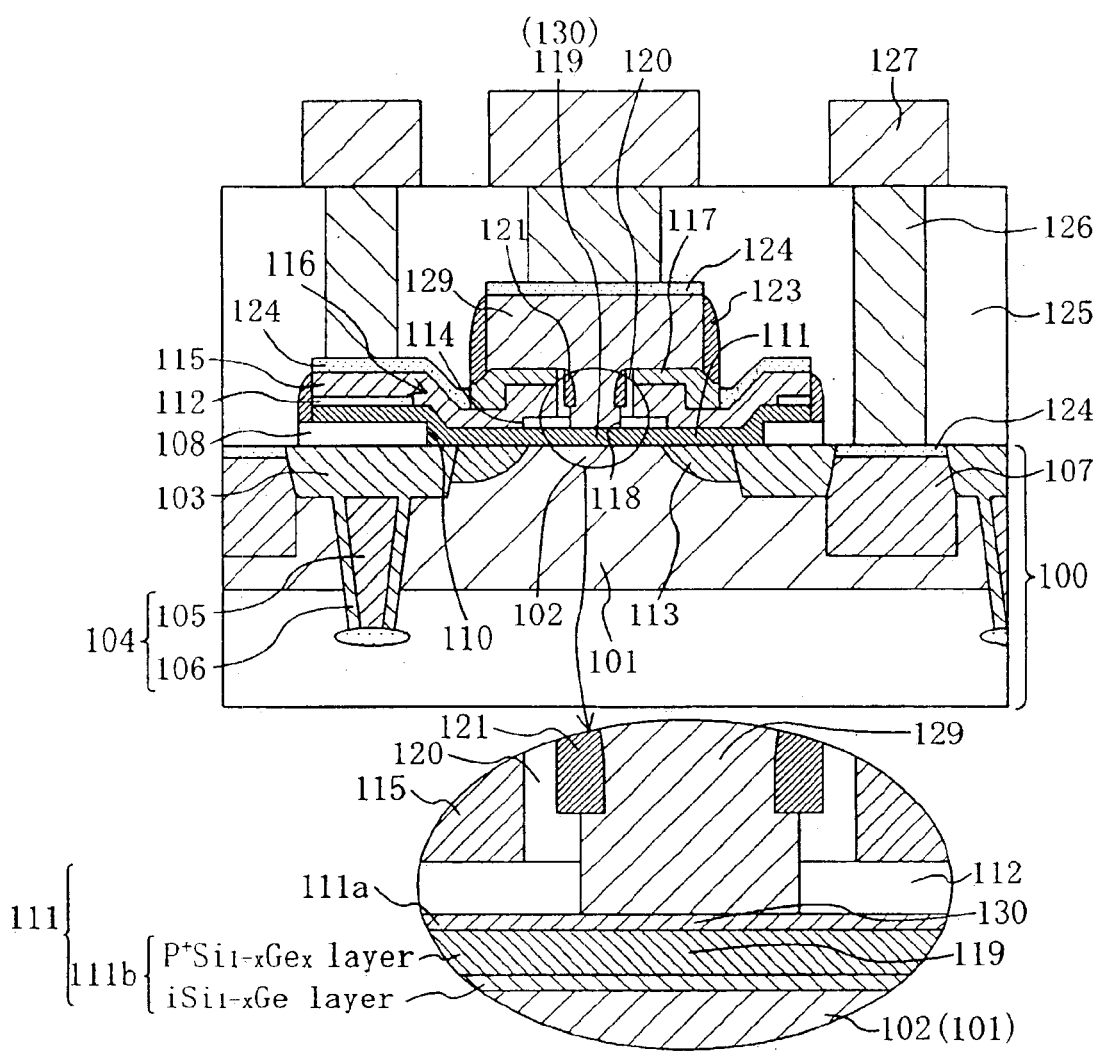
FIG. 8 is a cross-sectional view of a HBT as a semiconductor device of the second embodiment of the present invention.

FIG. 8 is a cross-sectional view of a semiconductor device of the second embodiment of the present invention, which is a heterobipolar transistor (HBT). Only the structure of the HBT is shown in FIG. 8. However, in many cases, a CMOS device is also mounted on the common substrate. In these cases, assume that MIS transistors of the CMOS device exist in a region not shown.

As shown in FIG. 8, the structure of the HBT of this embodiment is the same as that of the HBT of the first embodiment described above, except for the structure of the emitter lead electrode 129, the impurity concentration distribution in the Si cap layer 111a, and the like. Hereinafter, description is omitted for the same structures as those in the first embodiment, and only points different from the first embodiment will be described.

In this embodiment, the emitter lead electrode 129 is constructed of only the n+ polysilicon layer, and the emitter layer 130 made of the upper portion of the Si cap layer 111a is doped with phosphorus (P) in a concentration exceeding the solid-solubility limit for Si single crystal. However, the upper portion of the Si cap layer 111a is also doped with boron (B) in a comparatively high concentration, and, as will be described later, due to the existence of the boron (B) in the Si cap layer 111a, the boron (B) concentration distribution in the p+ $Si_{1-x}Ge_x$ layer as the internal base is kept sharp.

Figure 9A:
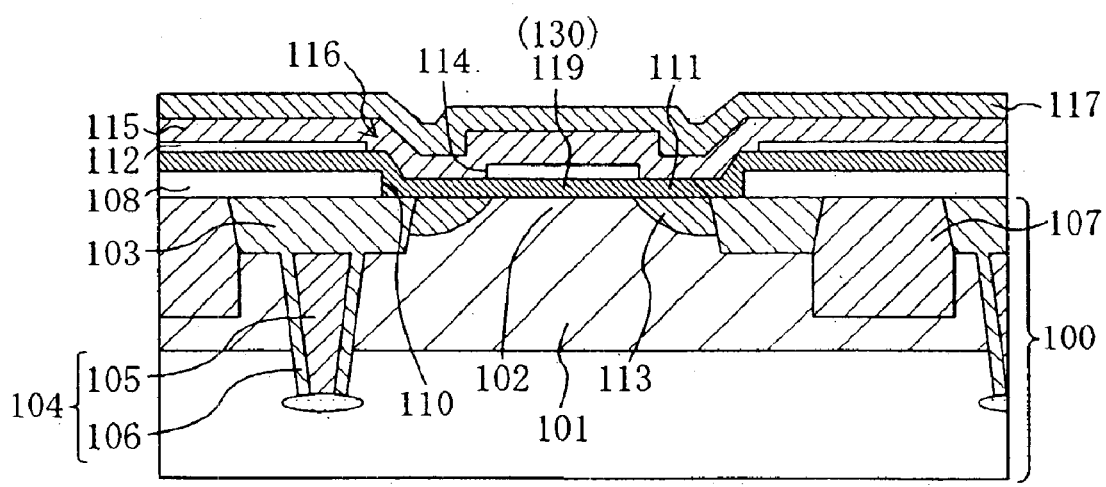
FIGS. 9(a) and 9(b) are cross-sectional views illustrating steps of depositing a p$^+$ polysilicon layer, diffusing boron (B), and then forming a base opening in the fabrication process of the semiconductor device of the second embodiment.
Figure 9B:
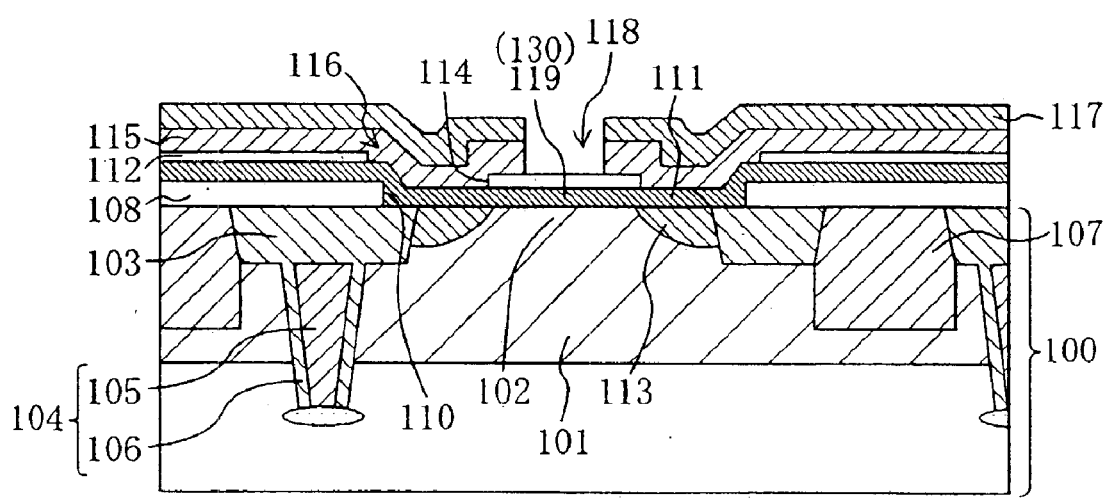

FIGS. 9(a) and 9(b) are views illustrating part of the fabrication process of the semiconductor device of this embodiment. The fabrication process in this embodiment follows the same process step shown in FIGS. 2(a) to 3(a) in the first embodiment, except that the thickness of the second buried oxide film 112 is about 10 nm in the embodiment.

Thereafter, in the step shown in FIG. 9(a), an undoped polysilicon film is deposited on the wafer by CVD and then boron (B) is introduced into the polysilicon film by ion implantation in a dose of $3\times10^{15}$ atoms.cm$^{-2}$, to form the densely-doped p+ polysilicon layer 115 having a thickness of about 150 nm. The third buried oxide film 115 having a thickness of about 100 nm is then deposited. Subsequently, heat treatment at 925° C. for 15 seconds is performed for diffusion of boron (B) in the p+ polysilicon layer 115. By this heat treatment, boron (B) in the p+ polysilicon layer 115 is introduced into the Si cap layer 111a via the second buried oxide film 112.

In the step shown in FIG. 9(b), the third buried oxide film 117 and the p+ polysilicon layer 115 are patterned by dry etching, to form the base opening 118 through the center portions of the third buried oxide film 117 and the p+ polysilicon layer 115 to reach the second buried oxide film 112. The base opening 118 is narrower than the center portion of the second buried oxide film 112, and thus does not overlap the base junction openings 114. By this process step, the external base 116 is formed, which is constructed of the p+ polysilicon layer 115 and the portion of the $Si/Si_{1-x}Ge_x$ layer 111 excluding the center portion thereof.

Thereafter, although not specifically illustrated, substantially the same process steps as those shown in FIGS. 4(a) to 5(b) are performed, except that in the formation of the emitter lead electrode 129, only the n+ polysilicon layer is deposited and patterned.

Figure 10:
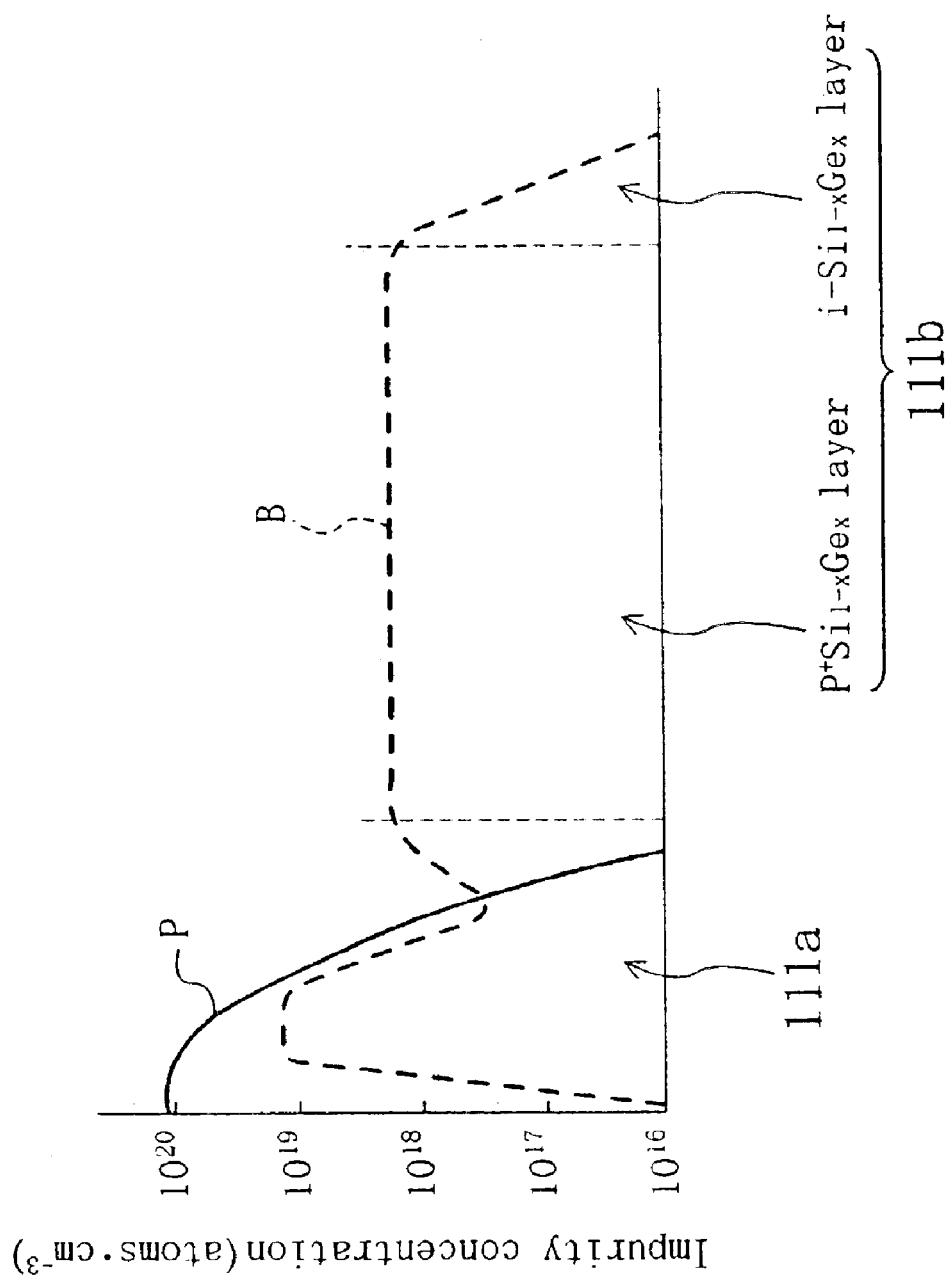
FIG. 10 is a schematic illustration of the concentration distributions of phosphorus (P) and boron (B) along the vertical section of a Si/Si$_{1-x}$Ge$_x$ layer in the second embodiment.

FIG. 10 is a schematic illustration of the concentration distributions of phosphorus (P) and boron (B) along the vertical section of the $Si/Si_{1-x}Ge_x$ layer 111 in this embodiment. As shown in FIG. 10, the upper portion of the Si cap layer 111a is doped with boron (B) in a high concentration by diffusion from the p+ polysilicon layer 115 via the second buried oxide film 112. Specifically, the boron (B) concentration in the Si cap layer 111a, which is extremely low at the interface with the emitter lead electrode 129, increases sharply toward the lower portion thereof and reaches a peak at a position apart from the interface with the emitter lead electrode 129 by several nanometers. As for the boron (B) concentration distribution in the p+ $Si_{1-x}Ge_x$ layer as the internal base 119, it keeps the sharpness without widely spreading into the Si cap layer 111a and the i—$Si_{1-x}Ge_x$ layer. Although the upper portion of the Si cap layer 111a is doped with boron (B) in a high concentration, the emitter 130 functions as a densely-doped n-type element because it is doped with phosphorus (P) in a higher concentration. Therefore, the function as the NPN bipolar transistor is not impaired. The attainment of the impurity concentration distributions as described above was confirmed by performing simulation as follows.

Figure 11:
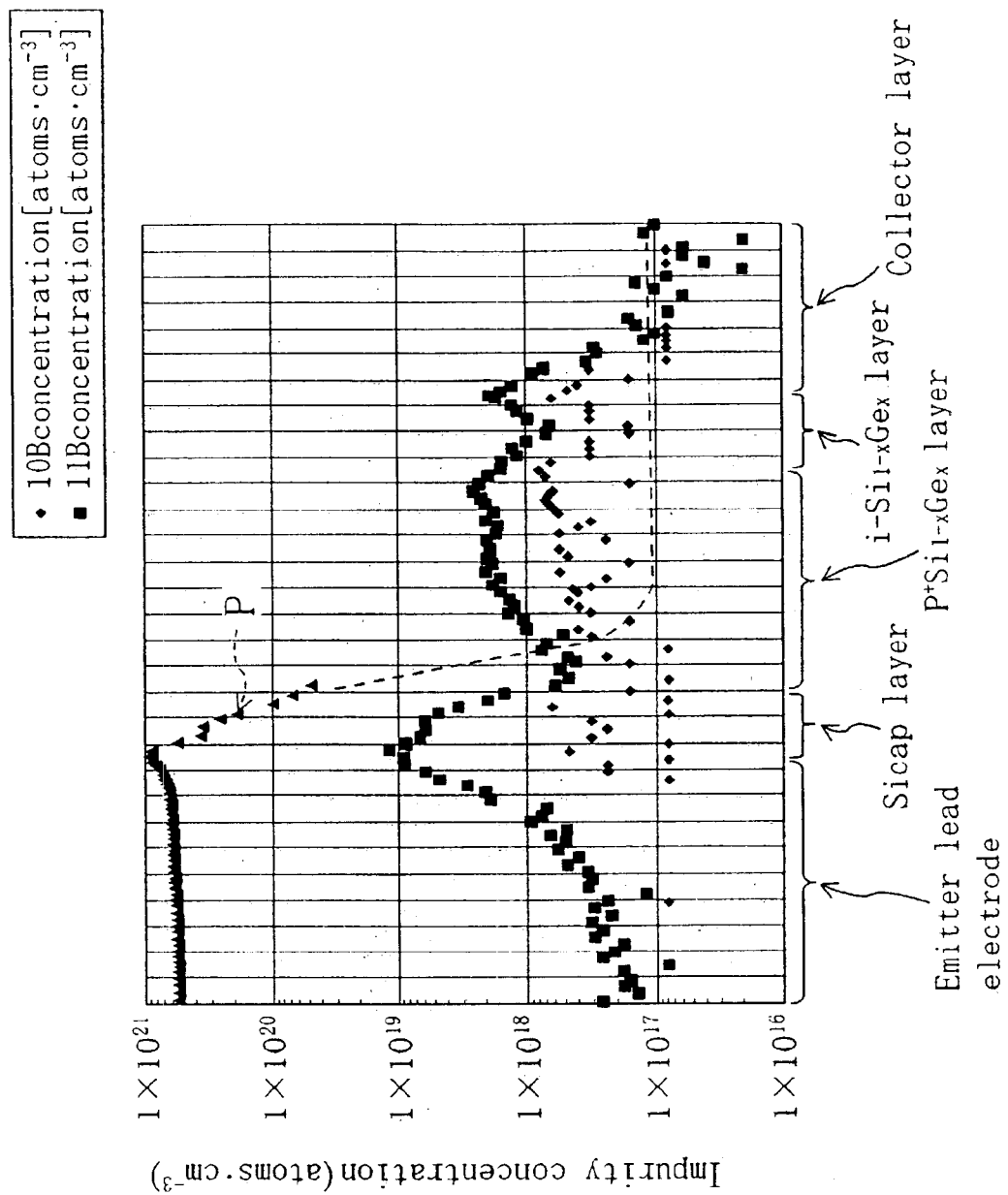
FIG. 11 is a view showing SIMS measurement data obtained when boron (B) was diffused from the p$^+$ polysilicon layer into a Si cap layer via an oxide film.

FIG. 11 is a view showing SIMS measurement data obtained when boron (B) was diffused into the Si cap layer from the p+ polysilicon layer via the oxide film as in the fabrication process of the semiconductor device of this embodiment. In FIG. 11, the x-axis represents the relative depth and the y-axis represents the concentration (atoms.cm$^{-3}$) of phosphorus (P) or boron (B). The boron concentration in the p+ polysilicon layer was set at $1\times10^{20}$ atoms.cm$^{-3}$, and the thickness of the oxide film interposed between the p+ polysilicon layer and the Si cap layer was set at 10 nm. Note that the day shown in FIG. 11 is for a sample in which the lead electrode was formed after the patterning of the p+ polysilicon layer. Heat treatment for drive-in diffusion was performed at 950° C. for 15 seconds. No specific data is shown in FIG. 11 on phosphorus (P) since no correct values were obtainable. However, the phosphorus concentration is presumed to have a distribution shown by the dashed line in FIG. 11.

From FIG. 11, it is found that concentration distributions of phosphorus (P) and boron (B) roughly corresponding to those in FIG. 10 were obtained. Specifically, diffusion of boron (B) from the p+ $Si_{1-x}Ge_x$ layer into the Si cap layer and the i—$Si_{1-x}Ge_x$ layer on both sides is suppressed, keeping the sharpness of the boron (B) concentration distribution. That is, diffusion of boron (B) toward the Si cap layer 111a and the collector layer 120 is suppressed. In a fabrication process as that in this embodiment, only boron 11B large in weight is introduced into the p+ polysilicon layer 115 by ion implantation. Therefore, it is found from FIG. 11 that the peak of boron (B) observed in FIG. 11 is generated, not by diffusion of boron (B) from the p+ $Si_{1-x}Ge_x$ layer, but by diffusion of boron from the p+ polysilicon layer 115. As the nature of SIMS measurement the range in which sputtering is performed varies. Therefore, although the boron concentration distribution in the p+ $Si_{1-x}Ge_x$ layer appears spreading, it is presumed that sharpness actually exists.

From the above, it is confirmed experimentally that the boron (B) concentration distribution in the p+ $Si_{1-x}Ge_x$ layer as the internal base can be kept sharp by diffusing boron (B) form the p+ polysilicon layer 115 into the Si cap layer 111a via the second buried oxide film 112, as in the fabrication process described above.

The reason why the boron (B) concentration distribution can be kept sharp has not yet been clarified. The present invention presume that the reason is as follows. Phosphorus (P) is diffused from the n+ polysilicon layer as the emitter lead electrode 129 into the Si cap layer 111a in a high concentration exceeding the solid-solubility limit for Si single crystal. Point defects are generated in the Si cap layer 111a due to this excessively high phosphorus concentration. However, such point defects are occupied by boron (B) diffused into the Si cap layer 111a from the p+ polysilicon layer 115. As a result, diffusion of boron (B) in the p+ $Si_{1-x}Ge_x$ layer as the internal base is suppressed.

In view of the above, at least the upper portion of the Si cap layer 111a is preferably doped with boron in a higher concentration than that in the p⁺ $Si_{1-x}Ge_x$ layer (internal base). The entire Si cap layer 111a may be doped with boron.

Preferably, the region of the Si cap layer 111a doped with boron (B) is included by the region doped with phosphorus in a higher concentration than the boron concentration in the former region. This ensures a high withstand voltage characteristic.

Other Embodiments

In the above embodiment, the p⁺ polysilicon layer 115 was doped with boron (B) by ion implantation. Alternatively, the p⁺ polysilicon layer 115 may be doped with boron (B) by in-situ doping.

The doping of the upper portion of the Si cap layer 111a with boron (B) in a high concentration is not limited to the method described in the above embodiment. For example, the upper portion of the Si cap layer 111a may be doped with boron in situ in a high concentration during the epitaxial growth of the Si cap layer 111a (in the step shown in FIG. 2(b) in the first embodiment) although illustration of this fabrication process is omitted. This method is advantageous over the fabrication method in the second embodiment in that the impurity concentration distribution in the Si cap layer 111a and the like can be controlled stably.

In the above embodiments, the base layer was constructed of the $Si_{1-x}Ge_x$ layer (0≦x<1). Alternatively, the base layer may be constructed of a $Si_{1-x-y}Ge_xC_y$ layer (0≦x,y<1) or a $Si_{1-y}C_y$ layer (0≦y<1), in place of the $Si_{1-x}Ge_x$ layer. At least one of the emitter and the collector may be constructed of a $Si_{1-x}Ge_x$ layer, a $Si_{1-x-y}Ge_xC_y$ layer, or a $Si_{1-y}C_y$ layer.

Figure 15:
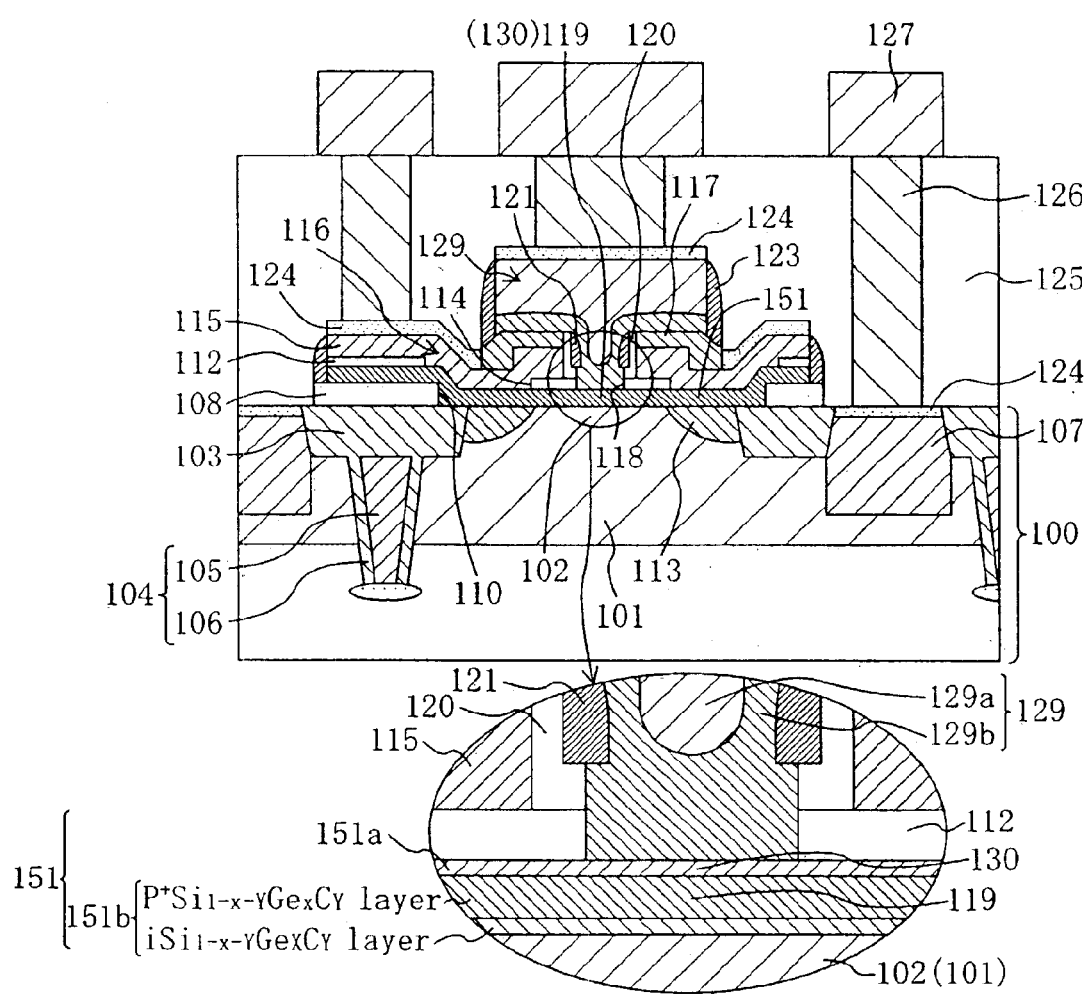
FIG. 15 is a cross-sectional view of an HBT as a modified semiconductor device of the first embodiment of the present invention.

FIG. 15 is a cross-sectional view of a heterobipolar transistor (HBT) as a modification of the first embodiment of the present invention, in which a $Si_{1-x-y}Ge_xC_y$ layer is provided in place of the $Si_{1-x}Ge_x$ layer. The structure of the HBT of this modification is the same as that of the HBT of the first embodiment described above, except for the following point. On the portion of the top surface of the Si substrate 100 exposed in the collector opening 110 and on the first buried oxide film 108, formed sequentially are a $Si_{1-x-y}Ge_xC_y$ layer 151b composed of an undoped layer (i—$Si_{1-x-y}Ge_xC_y$ layer) having a thickness of about 30 nm and a p-type impurity doped layer (p⁺ $Si_{1-x-y}Ge_xC_y$ layer) having a thickness of about 60 nm, and a Si cap layer 151a having a thickness of about 30 nm. The $Si_{1-x-y}Ge_xC_y$ layer 151b and the Si cap layer 151a constitute a $Si/Si_{1-x-y}Ge_xC_y$ layer 151 (see the partial enlarged view). The portion of the $Si/Si_{1-x}Ge_x$ layer 151 located on the exposed surface of the Si substrate 100 in the collector opening 110 has a single-crystal structure according to the crystal structure of the underlying Si substrate 100, while the portion thereof located on the first buried oxide film 108 has a polycrystal structure. Mainly the lower part of the center portion (region under the base opening 118) of the $Si_{1-x-y}Ge_xC_y$ layer 151b functions as the internal base 119, and the center portion of the Si cap layer 151a functions as the emitter layer. Most of the $Si_{1-x-y}Ge_xC_y$ layer is doped with a p-type impurity such as boron (B) in a concentration of about 2×10¹⁸ atoms.cm⁻³. The other components shown in FIG. 15 are the same as those in the first embodiment. These components are therefore denoted by the same reference numerals, and the description thereof is omitted here. In the fabrication process, the $Si_{1-x-y}Ge_xC_y$ layer is epitaxially grown in place of the epitaxial growth of the $Si_{1-x}Ge_x$ layer in the first embodiment.

Figure 16:
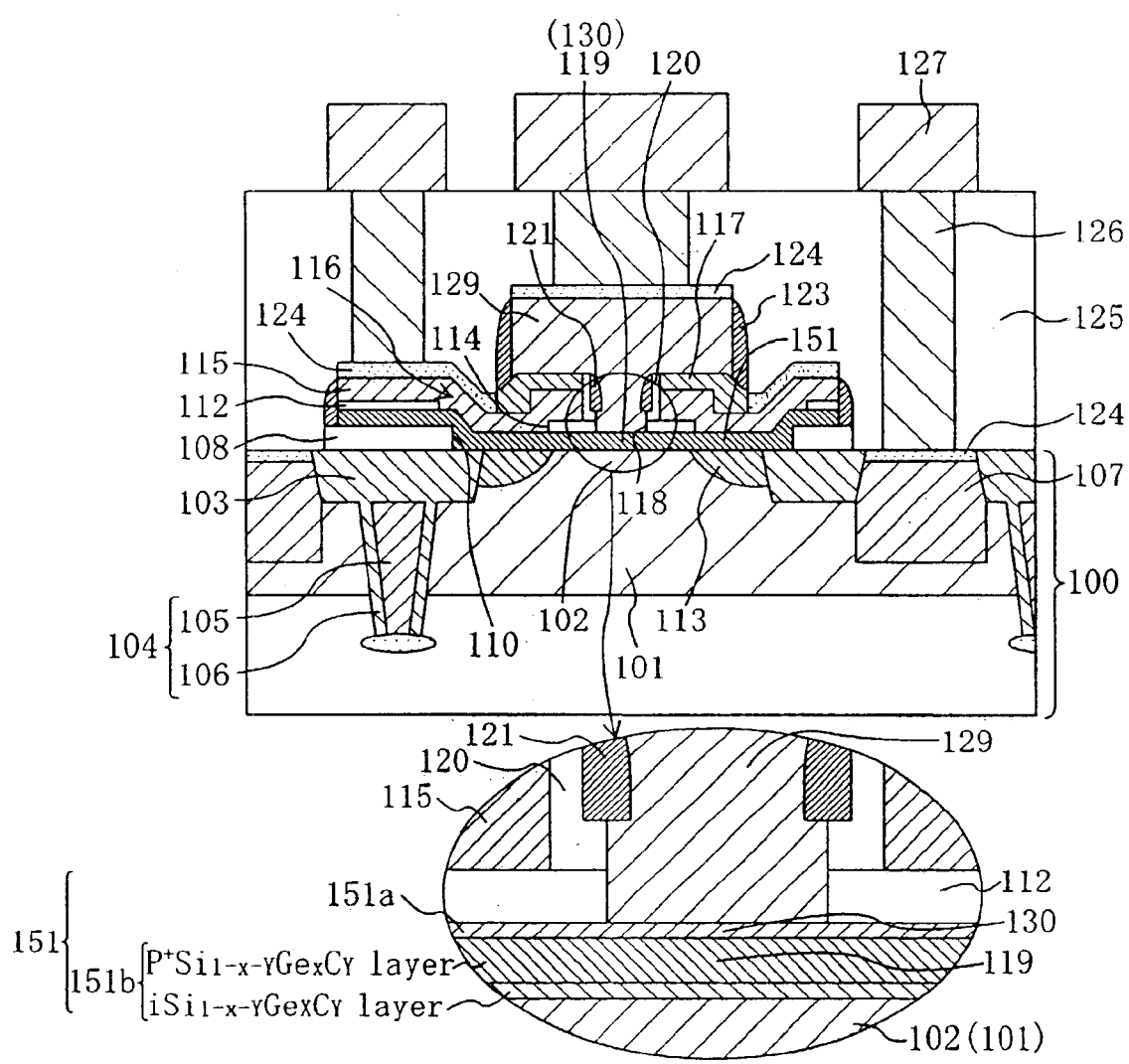
FIG. 16 is a cross-sectional view of an HBT as a modified semiconductor device of the second embodiment of the present invention.

FIG. 16 is a cross-sectional view of a heterobipolar transistor (HBT) as a modification of the second embodiment of the present invention, in which a $Si_{1-x-y}Ge_xC_y$ layer is provided in place of the $Si_{1-x}Ge_x$ layer. The structure of the HBT of this modification is the same as that of the HBT of the first embodiment described above, except for the structure of the emitter lead electrode 129, the impurity concentration distribution in the Si cap layer 151a, and the like. Description is omitted for the same structures as those in the modification of the first embodiment, and hereinafter only different points will be described.

In this modification, the emitter lead electrode 129 is constructed of only the n⁺ polysilicon layer, and the emitter layer 130 composed of the upper portion of the Si cap layer 151a is doped with phosphorus (P) in a concentration exceeding the solid-solubility limit for Si single crystal. The upper portion of the Si cap layer 151a is also doped with boron (B) in a comparatively high concentration, and due to the existence of boron (B), the boron (B) concentration distribution in the p⁺ $Si_{1-x-y}Ge_xC_y$ layer as the internal base is kept sharp. In the fabrication process, the $Si_{1-x-y}Ge_xC_y$ layer is epitaxially grown in place of the epitaxial growth of the $Si_{1-x}Ge_x$ layer in the second embodiment.

INDUSTRIAL APPLICABILITY

The semiconductor device of the present invention is usable as devices such as bipolar transistors mounted on electronic apparatus, in particular, as devices handling high-frequency signals.

What is claim is:

1. A method for fabricating a semiconductor device, comprising the steps of:
    (a) epitaxially growing a p-type second single-crystal semiconductor layer functioning as a base layer on an n-type first single-crystal semiconductor layer functioning as a collector layer on a substrate;
    (b) epitaxially growing a third single-crystal semiconductor layer on the second single-crystal semiconductor layer;
    (c) depositing an emitter lead electrode by sequentially laminating an n⁻ polysilicon layer and an n⁺ polysilicon layer, the n⁻ polysilicon layer containing phosphorus in a concentration equal to or lower than a concentration permitting phosphorus to be diffused into the third single-crystal semiconductor layer in a concentration as high as the solid-solubility limit for the third single-crystal semiconductor layer, and the n⁺ polysilicon layer containing phosphorus in a concentration higher than that in the n⁻ polysilicon layer; and
    (d) performing heat treatment for diffusing phosphorus in the n⁻ polysilicon layer so that the upper portion of the third single-crystal semiconductor layer is doped with phosphorus in a concentration equal to or lower than the solid-solubility limit, to form an emitter.

2. The method for fabricating a semiconductor device of claim 1, wherein the step (c), the concentration of phosphorus introduced into the semiconductor layer is increased in stages toward the upper portion.

3. The method, for fabricating a semiconductor device of claim 1, wherein in the step (c), the concentration of phosphorus introduced into the semiconductor layer is increased sequentially toward the upper portion.

4. The method of fabricating a semiconductor device of claim 1, wherein
    the first single-crystal semiconductor layer is a Si layer,
    the second single-crystal semiconductor layer is a SiGe layer, and
    the third single-crystal semiconductor layer is a Si layer.

5. The method for fabricating a semiconductor device of claim 1, wherein
the first single-crystal semiconductor layer is a Si layer,
the second single-crystal semiconductor layer is a SiGeC layer, and
the third single-crystal semiconductor layer is a Si layer.

6. The method for fabricating a semiconductor device of claim 1, wherein the n⁻ polysilicon layer has a recessed part and the n⁺ polysilicon layer has a protruded part, and
the emitter lead electrode is deposited to fit the recessed part to the protruded part.

7. A method for fabricating a semiconductor device comprising the steps of:
(a) epitaxially growing a p-type second single-crystal semiconductor layer functioning as a base layer on an n-type first single-crystal semiconductor layer functioning as a collector layer on a substrate
(b) epitaxially growing a third single-crystal semiconductor layer on the second single-crystal semiconductor layer;
(c) doping at least an upper portion of the third single-crystal semiconductor layer with a p-type impurity;
(d) forming a semiconductor layer containing phosphorus on the third single-crystal semiconductor layer; and
(e) performing heat treatment for diffusing phosphorus in the semiconductor layer so that the upper portion of the third single-crystal semiconductor layer is doped with phosphorus in a concentration higher than the concentration of the p-type impurity introduced in the step (c), to change the upper portion of the third single-crystal semiconductor layer into an emitter,
wherein the step (c) is performed simultaneously with the step (b) by epitaxially growing the third single-crystal semiconductor layer while being doped with the p-type impurity.

8. A method for fabricating a semiconductor device comprising the steps of:
(a) epitaxially growing a p-type second single-crystal semiconductor layer functioning as a base layer on an n-type first single-crystal semiconductor layer functioning as a collector layer on a substrate;
(b) epitaxially growing a third single-crystal semiconductor layer on the second single-crystal semiconductor layer;
(c) doping at least an upper portion of the third single-crystal semiconductor layer with a p-type impurity;
(d) forming a semiconductor layer containing phosphorus on the third single-crystal semiconductor layer;
(e) performing heat treatment for diffusing phosphorus in the semiconductor layer so that the upper portion of the third single-crystal semiconductor layer is doped with phosphorus in a concentration higher than the concentration of the p-type impurity introduced in the step (c), to change the upper portion of the third single-crystal semiconductor layer into an emitter;
(f) forming an insulating layer on the third single-crystal semiconductor layer after the step (b) and before the step (c); and
(g) forming a semiconductor layer containing a p-type impurity on the insulating layer,
wherein the step (c) is performed by introducing the p-type impurity into the third single-crystal semiconductor layer from the semiconductor layer via the insulating layer.

* * * * *

UNITED STATES PATENT AND TRADEMARK OFFICE
CERTIFICATE OF CORRECTION

PATENT NO. : 6,893,934 B2  
DATED : May 17, 2005  
INVENTOR(S) : Teruhito Ohnishi et al.

It is certified that error appears in the above-identified patent and that said Letters Patent is hereby corrected as shown below:

Title page,  
Item [75], Inventors, change "Teruhit Ohnishi" to -- Teruhito Ohnishi --.  
Item [62], Related U.S. Application Data, change "Division of application No. 10/009,201, filed as application No. PCT/JP01/03979 on May 14, 2001, no Pat. No., 6,674,149." to -- Division of application No. 10/009,201, filed December 10, 2001, which is a 371 application of PCT/JP01/03979 filed May 14, 2001, now Pat. No. 6,674,149. --.  
Item [56], References Cited, FOREIGN PATENT DOCUMENTS, add  
-- EP 1 037 284 9/2000 --.

Column 19,  
Line 17, change "on a substrate" to -- on a substrate; --.

Signed and Sealed this

Sixteenth Day of August, 2005

JON W. DUDAS  
*Director of the United States Patent and Trademark Office*